United States Patent
Henley

(10) Patent No.: US 10,978,429 B2
(45) Date of Patent: Apr. 13, 2021

(54) LIGHT EMITTING DIODE (LED) MASS-TRANSFER APPARATUS AND METHOD OF MANUFACTURE

(71) Applicant: Apple Inc., Cupertino, CA (US)

(72) Inventor: Francois J. Henley, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/019,012

(22) Filed: Jun. 26, 2018

(65) Prior Publication Data

US 2018/0374829 A1  Dec. 27, 2018

Related U.S. Application Data

(60) Provisional application No. 62/525,105, filed on Jun. 26, 2017.

(51) Int. Cl.
| | | |
|---|---|---|
| *H01L 25/075* | (2006.01) | |
| *H01L 25/16* | (2006.01) | |
| *H01L 33/00* | (2010.01) | |
| *H01L 21/78* | (2006.01) | |
| *H01L 33/06* | (2010.01) | |

(Continued)

(52) U.S. Cl.
CPC .......... *H01L 25/0753* (2013.01); *H01L 21/78* (2013.01); *H01L 21/7806* (2013.01); *H01L 25/167* (2013.01); *H01L 33/00* (2013.01); *H01L 33/0093* (2020.05); *H01L 33/0095* (2013.01);

(Continued)

(58) Field of Classification Search
CPC . H01L 25/0753; H01L 33/0095; H01L 21/78; H01L 33/00; H01L 21/7806; H01L 33/0079; H01L 25/167; H01L 33/06; H01L 22/20; H01L 33/32; H01L 33/0093
See application file for complete search history.

(56) References Cited

U.S. PATENT DOCUMENTS

| | | | | |
|---|---|---|---|---|
| 4,860,296 A | * | 8/1989 | Chemla | B82Y 20/00 372/44.01 |
| 5,634,267 A | * | 6/1997 | Farnworth | G01R 1/0466 29/840 |

(Continued)

FOREIGN PATENT DOCUMENTS

| | | |
|---|---|---|
| KR | 1020150082414 A | 7/2015 |
| KR | 1020170023920 A | 3/2017 |

(Continued)

OTHER PUBLICATIONS

International Search Report and Written Opinion for PCT/US2018/039533 Filed Jun. 26, 2018.

(Continued)

*Primary Examiner* — Stephen W Smoot
*Assistant Examiner* — Vicki B. Booker
(74) *Attorney, Agent, or Firm* — Jaffery Watson Mendonsa & Hamilton LLP

(57) ABSTRACT

Embodiments relate to mass-transfer methods useful for fabricating products containing Light Emitting Diode (LED) structures. LED arrays are transferred from a source substrate to a target substrate by beam-assisted release (BAR) of a plurality of LED devices in a high-speed flexible manner. The BAR mass-transfer approach is also able to utilize a Known Good Die (KGD) data file of the source substrate to transfer only functionally good die and avoid rework and yield losses.

14 Claims, 18 Drawing Sheets

(51) Int. Cl.
H01L 21/66 (2006.01)
H01L 33/32 (2010.01)
(52) U.S. Cl.
CPC .............. *H01L 22/20* (2013.01); *H01L 33/06* (2013.01); *H01L 33/32* (2013.01)

(56) References Cited

U.S. PATENT DOCUMENTS

| | | | |
|---|---|---|---|
| 9,412,663 B1* | 8/2016 | Andry | H01L 21/78 |
| 2006/0154390 A1 | 7/2006 | Tran et al. | |
| 2006/0225273 A1* | 10/2006 | Arneson | H05K 13/046 |
| | | | 29/834 |
| 2011/0151602 A1 | 6/2011 | Speier | |
| 2014/0120640 A1 | 5/2014 | Shieh et al. | |
| 2015/0295009 A1 | 10/2015 | Wang et al. | |
| 2016/0118332 A1 | 4/2016 | Lin | |
| 2016/0172244 A1* | 6/2016 | Tanaka | H01L 21/78 |
| | | | 438/125 |

FOREIGN PATENT DOCUMENTS

| | | |
|---|---|---|
| WO | 2017037475 A1 | 3/2017 |
| WO | 2017066921 A1 | 4/2017 |

OTHER PUBLICATIONS

PCT/US/2018/039533, "Extended European Search Report", dated Feb. 19, 2021, 9 pages.

\* cited by examiner

Side View

Top View

LIGHT EMITTING DIODE (LED) MASS-TRANSFER APPARATUS AND METHOD OF MANUFACTURE

This application is a nonprovisional of U.S. Patent Application No. 62/525,105 filed Jun. 26, 2017, the contents of which are incorporated by reference herein.

FIELD OF INVENTION

The present invention relates to light emitting diode (LED) devices. More particularly, embodiments of the invention relate to techniques, including methods and apparatus to efficiently transfer a plurality of Light Emitting Diode (LED) devices from a source surface to a target surface during the manufacturing process. In an example, the method is useful in general LED device transfer and placement and is particularly useful for mass-transfer of micro-LED (uLED) devices that can be as small as a few microns on a side. Micro-LEDs are grown on a support substrate utilizing techniques such as Metallo-Organic Chemical Vapor Deposition (MOCVD) among others. Before the individual devices are used in their final lighting or display application, it is desirable to test the LED devices to establish Known Good Die (KGD) data that can drive a mass-transfer apparatus to place the LED devices with high speed and yield.

BACKGROUND OF INVENTION

Light emitting diodes (LEDs) have been used as a replacement technology for conventional light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

Although highly successful, improved techniques for manufacturing LEDs is highly desired.

SUMMARY

During the LED manufacturing process, LED structures are formed on a substrate using mass-production processes like those utilized by the semiconductor industry. Process steps such as cleaning, deposition, lithography, etching and metallization are used to form the basic LED structure. To achieve mass-production scale manufacturing and lower cost, numerous devices are simultaneously formed on a substrate using these processes. Different substrates and materials are used depending on the type of LED desired. For example, UV-emitting LEDs are typically made from Gallium Nitride (GaN) material that have usually been either a heteroepitaxial layer on sapphire or free-standing GaN substrates made using Hydride Vapor Phase Epitaxy (HVPE) or ammonothermal methods. For other colors, GaAs or GaP substrates can be used. Recently, GaN, GaAs or other III-V semiconductor materials layer-transferred onto a support substrate has become available as another starting substrate type. These and possibly other LED structures can be mass-transferred using apparatus and methods disclosed in this invention to effect rapid and accurate placement of these LED device structures from a source surface (usually a substrate) with a source areal density to a target surface with an often different target areal density.

Such a density conversion is needed to use a source substrate of LED devices usually arranged in an array to numerous possible target substrate configurations. TVs, laptop screens, computer monitors, cellphone, appliance, automotive and wearable displays are but a few examples that would require programmable areal density mass-transfer apparatus and methods.

Most Micro-LED device "printing" methods are increased throughput versions of the "pick and place" manufacturing method successfully used in many industries including the semiconductor industry. In the semiconductor industry, individual integrated circuit die are often picked from a tray and placed in a final interconnect substrate, interposer or the like. Examples of companies pursuing improved pick and place mass-transfer strategies for Micro-LED manufacturing include Apple Inc. of Cupertino Calif. and X-Celeprint of Cork Ireland. Both companies are developing variants that pick a plurality of LED devices and then place them onto at least a portion of the target surface. The fitness for use of these methods are characterized by throughput, options for printing only Known Good Die Micro-LED devices and transfer yield. Current approaches suffer from limitations in each of these criteria. For example, X-Celeprint has recently disclosed some particulars of their micro-transfer-printing capability (SPIE Photonics West 2017 paper 10124-44 and SID 2017 Conference paper 19.4). The throughput is claimed to exceed about 1 million LEDs per hour and that the method has limited to non-existent ability to print KGD devices. Instead, the company suggests an array of post print repair methods. These limitations are believed to be a fundamental result of the physical pick and place approach and difficult to further improve.

The inherent difficulty in utilizing KGD test data to transfer only functionally good dies with a pick and place method can be appreciated by realizing that a physical stamp pick and place method lifts a specific device array from the source substrate and places the array at a specific location within the target substrate. It is essentially "blind" printing of the source array, irrespective of the level of die functionality. The only solution to utilize KGD data would be to lower throughput by adding a non-functional die removal step before target substrate transfer followed by subsequent population of the missing dies later.

The following 4 k UHD TV display example will serve to show how these traditional pick and place methods fall short to be an effective solution for commercially competitive micro-LED manufacturing. This display contains 8.3 million RGB pixels or about 25 million sub-pixels. At 1 million sub-pixel transfer rate per hour, the X-Celeprint system would require about 25 hours to fully populate one 4 k UHD TV. Assuming a 1 TV/minute rate of manufacture for a large-scale TV manufacturing line, an impractical number of micro-transfer-print systems (over 1500) are required. Moreover, post-transfer printing repair will be a major reduction in effective throughput and require substantial rework. Assuming a 10 ppm non-functional micro-LED rate from transfer errors and transferring non-functional dies, each TV will have an average of 250 bad sub-pixels requiring some form of repair. The reliance on post-transfer repair is not only impractical but expensive and fraught with yield and quality issues.

New approaches and methods to generate a KGD data file of the source substrate and flexibly and rapidly transfer only KGD devices meeting a selected set of functional specifications with very low transfer error rate is needed. High placement speed, accuracy and final device functional yield are but a few requirements that are needed for achieving commercially competitive micro-LED manufacturing.

The mass-transfer apparatus and method described in this invention addresses the requirements of commercially competitive micro-LED manufacturing though the use of an energy beam such as a laser beam to rapidly release a KGD die from the source substrate to the target substrate based on meeting die/location matching criteria. According to certain preferred embodiments of this invention, use of a vertical LED structure that relax the placement accuracy from a specific sub-pixel location to an X-Y area within the sub-pixel called the footprint can substantially improve throughput and matching count. Specific pixels that remain unmatched can be populated by moving the source substrate to a second location. Such moves are repeated until all sub-pixels have been matched & populated. For this invention, pixels and sub-pixels will be used interchangeably to denote a site where a LED device is to be assembled.

The mass-transfer apparatus utilizes a KGD data file to avoid transferring LEDs that are non-functional according to preset criteria. To be practical in a manufacturing environment, the functional test method needs to rapidly test dense micro-LED source substrate arrays. For example, a 6" substrate with an array of 10 μm×10 μm micro-LEDs with and a 5 mm edge exclusion will contain approximately 150 million LED devices. Approaches to non-direct contact functional test of such arrays has been developed by this inventor and has been described by U.S. Pat. Application No. 62/522,576 entitled "LIGHT EMITTING DIODE (LED) TEST APPARATUS AND METHOD OF MANUFACTURE", which is hereby incorporated by reference herein for all purposes.

The key benefit afforded by this mass-transfer method is its ability to populate KGD LED devices at a high rate estimated to exceed 100-250 million LEDs per hour. This would make the method able to make target products in a virtually error-free manner and at a rate that is compatible with high-volume manufacturing lines.

The apparatus and method as described in this invention is described as Beam-Addressed Release (BAR) mass-transfer equipment and methods.

DETAILED DESCRIPTION

Figure 1:
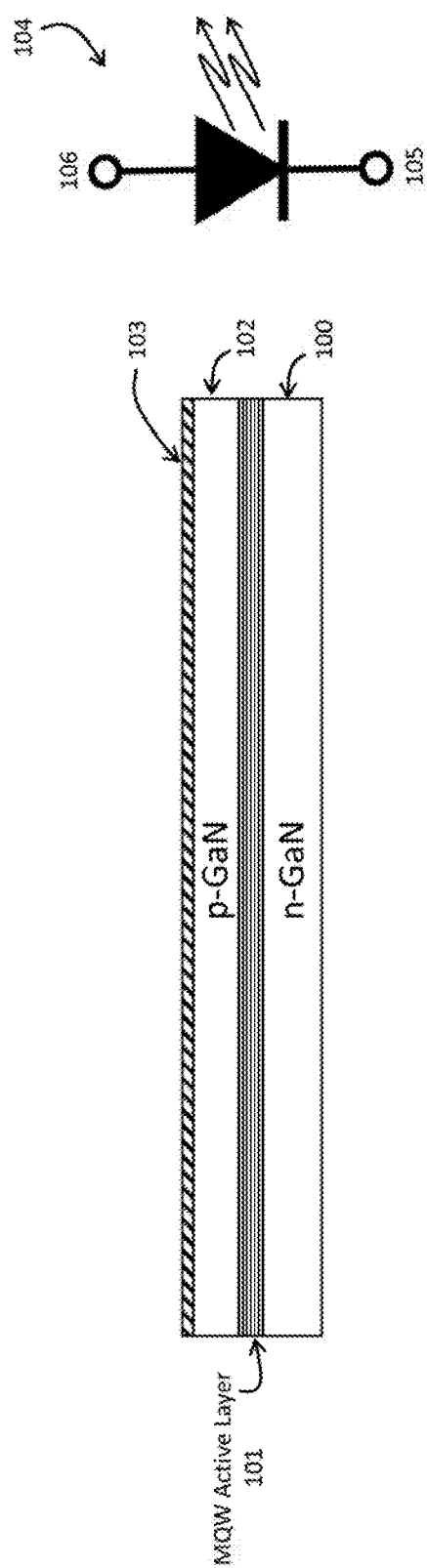
FIG. 1 shows a simplified cross-section of an LED structure.

A further explanation of LEDs is found throughout the present specification and more particularly below. In an example, one type of LED is an organic light emitting diode (OLED) in which the emissive layer of the diode is formed of an organic compound. One advantage of OLEDs is the ability to print the organic emissive layer on flexible substrates. OLEDs have been integrated into thin, flexible displays and are often used to make the displays for portable electronic devices such as cell phones and digital cameras.

Another type of LED is a semiconductor-based LED in which the emissive layer of the diode includes one or more semiconductor-based quantum well layers sandwiched between thicker semiconductor-based cladding layers. Some advantages of semiconductor-based LEDs compared to OLEDs can include increased efficiency and longer lifespan. High luminous efficacy, expressed in lumens per watt (lm/W), is one of the main advantages of semiconductor-based LED lighting, allowing lower energy or power usage compared to other light sources. Luminance (brightness) is the amount of light emitted per unit area of the light source in a given direction and is measured in candela per square meter ($cd/m^2$) and is also commonly referred to as a Nit (nt). Luminance increases with increasing operating current, yet the luminous efficacy is dependent on the current density ($A/cm^2$), increasing initially as current density increases, reaching a maximum and then decreasing due to a phenomenon known as "efficiency droop." Many factors contribute to the luminous efficacy of an LED device, including the ability to internally generate photons, known as internal quantum efficiency (IQE). Internal quantum efficiency is a function of the quality and structure of the LED device. External quantum efficiency (EQE) is defined as the number of photons emitted divided by the number of electrons injected. EQE is a function of IQE and the light extraction efficiency of the LED device. At low operating current density (also called injection current density, or forward current density) the IQE and EQE of an LED device initially increases as operating current density is increased, then begins to tail off as the operating current density is increased in the phenomenon known as the efficiency droop. At low current density, the efficiency is low due to the strong effect of defects or other processes by which electrons and holes recombine without the generation of light, called non-radiative recombination. As those defects become saturated radiative recombination dominates and efficiency increases. An "efficiency droop" or gradual decrease in efficiency begins as the injection-current density surpasses a low value, typically between 1.0 and 10 $A/cm^2$.

Semiconductor-based LEDs are commonly found in a variety of applications, including low-power LEDs used as indicators and signage, medium-power LEDs such as for light panels and automotive tail lights, and high-power LEDs such as for solid-state lighting and liquid crystal display (LCD) backlighting. In one application, high-powered semiconductor-based LED lighting devices may commonly operate at 400-1,500 mA, and may exhibit a luminance of greater than 1,000,000 $cd/m^2$. High-powered semiconductor-based LED lighting devices typically operate at current densities well to the right of peak efficiency on the efficiency curve characteristic of the LED device. Low-powered semiconductor-based LED indicator and signage applications often exhibit a luminance of approximately 100 $cd/m^2$ at operating currents of approximately 20-100 mA. Low-powered semiconductor-based LED lighting devices typically operate at current densities at or to the right of the peak efficiency on the efficiency curve characteristic of the LED device. To provide increased light emission, LED die sizes have been increased, with a 1 $mm^2$ die becoming a fairly common size. Larger LED die sizes can result in reduced current density, which in turn may allow for use of higher currents from hundreds of mA to more than an ampere, thereby lessening the effect of the efficiency droop associated with the LED die at these higher currents.

LEDs have been used in portable devices such as watches, smartphones and laptops as well as computer monitors and TV displays for many years however only indirectly as an alternative white light source for Liquid-Crystal Display (LCD) display technologies. These were called "LED" TVs and the like, but the actual LEDs were predominantly GaN-based white LEDs to illuminate the backlight in lieu of the cold fluorescent lamp (CFL) backlight sources used before. The color pixel generation continued to be based on LCD technology that worked by a light subtraction process where colors are generated by blocking other colors using an intervening color filter. For example, a red pixel would be generated by a red color filter that blocked the green and blue portion of the backlight LED white spectrum. Grey scale (light intensity of the pixel) occurred by modulating light polarization through a liquid-crystal cell placed between two crossed polarizers along the light path.

Although the LED backlight driven LCD display technology was more efficient and reliable than the CFL backlit version, the technology is still not power efficient. The reason is simple: although the LED white backlight devices can be fairly efficient in terms of external quantum efficiency (photons emitted per electrical carriers injected into the LED device), there are numerous inefficiencies in the rest of this LCD display technology. The first polarizer will cut a little half of the non-polarized white backlight, then each pixel is colorized by subtracting ⅔ of the remaining light (R without GB for red, G without RB for green and B without RG for blue). Other losses include pixel fill factor and film/LCD cell absorption and scattering. The total light output is therefore less than about ⅙ of the white LED backlight intensity.

The trend is for more power efficient and bright display technologies, especially with portable, battery operated devices where battery life is a key factor. Micro-LED is a promising technology for achieving higher power efficiencies. In a micro-LED display, a small LED device placed within a pixel area is directly driven to generate light in a direct emissive manner. Color can be generated either by (i) utilizing blue to UV-LEDs (i.e. GaN-based) with color phosphors or quantum-dot color conversion layers to generate the pixel colors by photon down conversion and/or (ii) by using LEDs that generate the color directly (i.e. AlGaAs, GaAsP, AlGaInP, GaP for red, GaP, AlGaInP, AlGaP for green and ZnSe, InGaN, SiC for blue). In either case, the direct emission/direct view of the micro-LED display promises a six-fold improvement or more in power efficiency.

Although the basic technology to realize micro-LED based displays is well known, numerous manufacturing and quality control challenges exist. One of these is functionally testing millions of micro-LED devices within the manufacturing process in a cost-effective and efficient manner before the pixels are committed to use. Another is the flexible, fast and error-free mass-transfer of micro-LED devices from the source or support substrate to a target surface, plate or area. It is therefore desired to enable KDG data file driven mass-transfer of micro-LED devices and in a manner compatible with micro-LED large-scale manufacturing processes. Further details of the present invention can be found throughout the present specification and more particularly below.

Embodiments of the present invention describe LED device fabrication processes and manners of mass-transfer of LED devices without pick and place approaches. In particular, some embodiments of the present invention may relate to manners of mass-transfer of high-brightness LED, medium power LED, low-power LED and micro LED devices.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment" means that a feature, structure, configuration, or characteristic described in connection with the embodiment is included in at least one embodiment of the invention. Thus, the appearances of the phrase "in one embodiment" in various places throughout this specification are not necessarily referring to the same embodiment of the invention. Furthermore, the features, structures, configurations, or characteristics may be combined in any suitable manner in one or more embodiments.

The terms "spanning", "over", "to", "between" and "on" as used herein may refer to a relative position of one layer with respect to other layers. One layer "spanning," "over" or "on" another layer or bonded "to" or in "contact" with another layer may be directly in contact with the other layer or may have one or more intervening layers. One layer "between" layers may be directly in contact with the layers or may have one or more intervening layers.

Certain embodiments of the invention describe an LED device assembly in which an LED device structure layer is transferred from a growth substrate and bonded to a support substrate or plate assembly before further processing. In accordance with embodiments of the present invention, the BAR mass-transfer step can be applied either before the transfer or after one or more transfers. For the purposes of simplifying the various possible configurations wherein the plurality of the LED structures is transferred and possibly bonded onto a different substrate, the resulting substrate (either the growth, support substrate or an assembly) shall be called a source substrate in each case when utilized as a source of devices within the BAR apparatus. For example, the substrate that supported the LED structures during MOCVD growth is also called a source substrate if used within the BAR mass-transfer apparatus directly, however after release and attachment to a support plate, such a plate and any other substrate or plate used to mechanically support the LED device layer will also be called a source substrate. Additionally, the support substrate can be a flexible sheet such as a plastic film to be mounted as a source substrate within the BAR apparatus. The term source substrate will be generally used to connotate its role as mechanical support and will be the substrate described as part of the BAR mass-transfer apparatus throughout this description.

Depending on the specific embodiment of this invention, the support substrate can be transparent and have additional coatings. These either directly support the BAR mass-transfer process or exist as part of the requirements of the specific LED manufacturing process step as will be described in more detail below.

Referring to FIG. 1, a representative LED 104 comprises of deposited layers that form a n-type cathode layer 100, an active layer (usually a Multi-Quantum Well or MQW series of sub-layers) 101 and a p-type layer 102 and p-contact 103. This LED structure is simplified and many additional layers such a buffer layers, blocking layers, n-contact layer(s) and the like are not shown for simplicity. Electrically, the LED would be contacted through layer 103 (or contact 106) as the anode and through layer 100 (or contact 105) as the cathode. In some LED structures, the n and p layers can also be contact layers and thus can be named interchangeably for purposes of this invention unless specifically described otherwise. Passing current through the LED device using a forward (positive voltage) bias from anode to cathode would generate light from radiative recombination processes from carriers flowing through the active region. The design of the active layer 101 is optimized for maximizing radiative recombination processes that emit light. Reverse biasing the LED structure will not generate light. Limiting reverse bias voltage is important with LEDs to avoid damaging or destroying the device through a process called breakdown. Within a safe reverse bias region, small leakage currents flow through the device.

Figure 2:
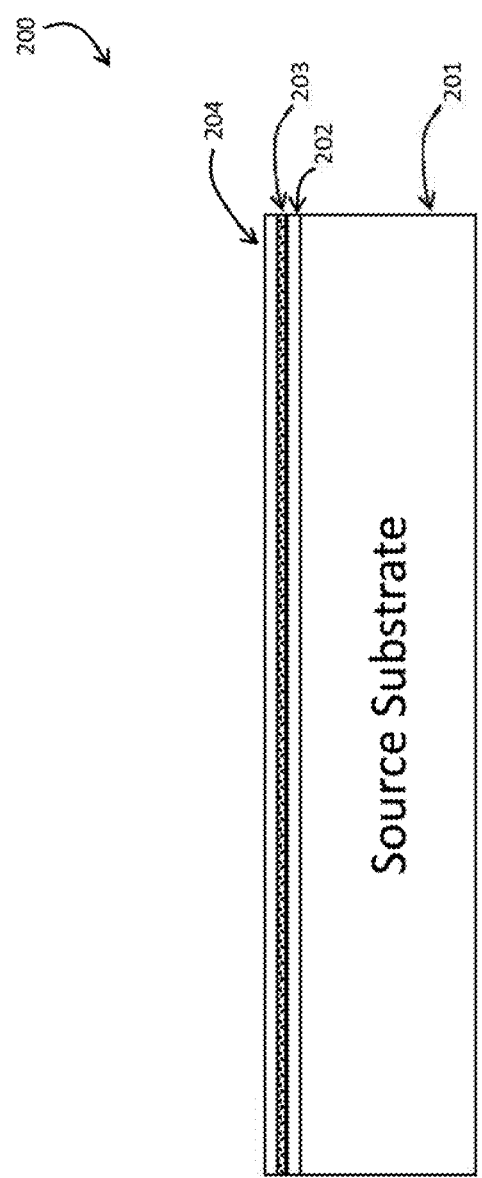
FIG. 2 shows an LED source substrate containing LED device structures within an LED mass-production process.

In LED manufacturing, the LED devices are made in mass-production using methods similar to substrate-based mass-production processes common in the semiconductor industry. Referring to FIG. 2, the LED structure described in FIG. 1 is deposited onto a suitable growth or support substrate 201 to make an LED substrate 200. Depending on the type, quality and color of the LED desired, different substrate material types can be used. Examples are GaP, GaAs, GaN substrates or heteroepitaxial growth substrates such as sapphire and silicon carbide (SiC) are also possible. Layer-transferred semiconductor layered template substrates are yet another type of growth substrate. The LED structure is then growth to develop a lower contact 202 (n-type or cathode in this example), active region 203 and upper contact 204 (p-type or anode in this example).

Figure 3B:
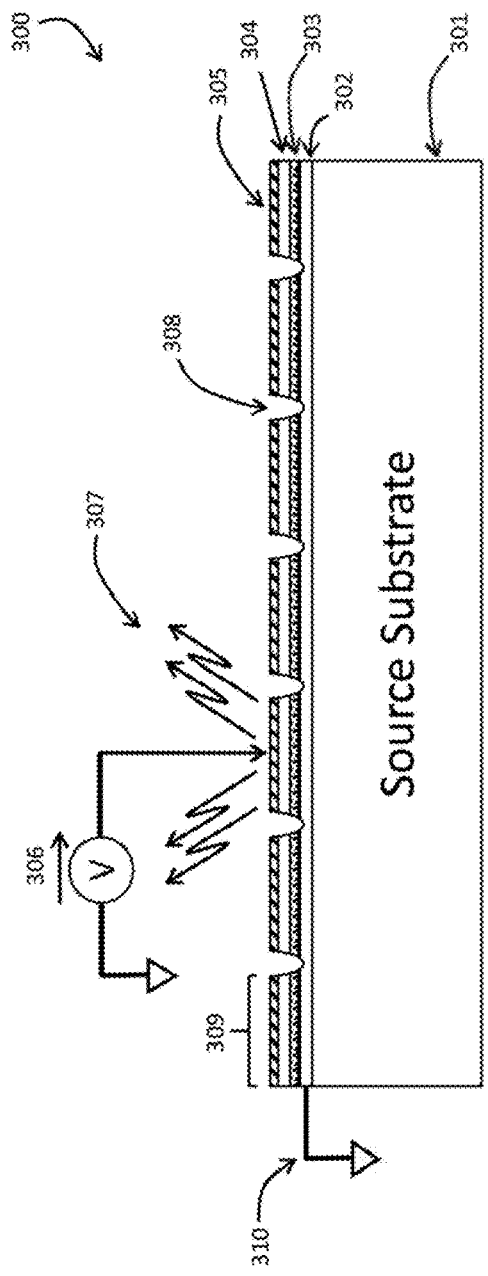
FIGS. 3A-B show a top view (A) and a cross-sectional view (B) of a LED source substrate with singulated LED devices isolated by streets.
Figure 3A:
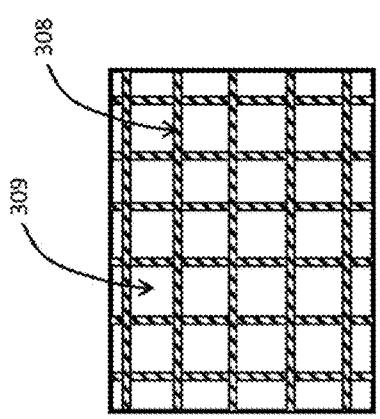

The LED substrate of FIG. 2 contains multiple, non-singulated LED structures. Isolation of individual LED devices of the desired size and function can be made within the LED manufacturing sequence using process steps such as etching, lithography, passivation and deposition. Referring to FIGS. 3A and 3B, the desired LED devices can be isolated while residing on support substrate 301 using processes such as etching to form for example a trench 308. If these etch structures (sometimes called "streets") are made over the substrate to form individually isolated structures such as square devices, a high number of LED devices 309 are electrically isolated and available for release and packaging. In this example, the trench 308 does not etch through the bottom common contact layer 302 and can thus be connected to a common potential 310. Each LED device 309 can thus be individually contacted using a voltage source 306 to the p-layer 304 and p-contact layer 305. Light 307 can then be measured from the contacted device to evaluate its functionality. In this example, a top emitting LED structure is shown where the top contact 305 could be a transparent electrode such as Indium Tin Oxide (ITO). Other structures are possible such as a bottom emitting structure. In this case, the support structure would be preferably transparent and the p-contact layer would be a light reflecting layer such as a metal layer. Of course, there can be other variations, modifications, and alternatives.

Figure 4:
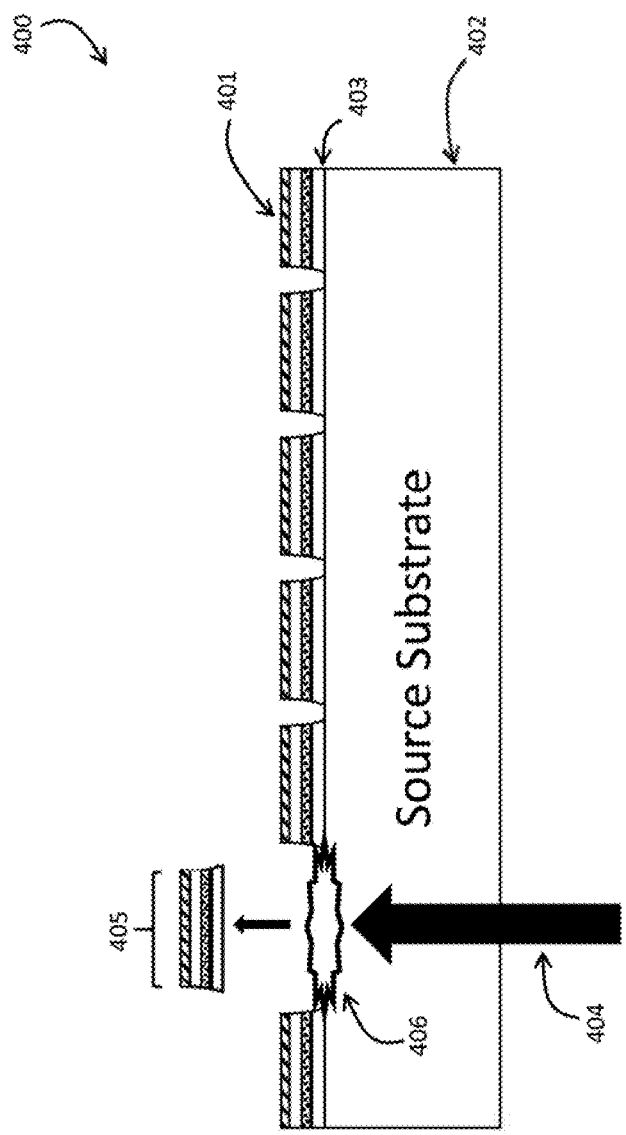
FIG. 4 shows a cross-sectional view an LED source substrate with singulated LED devices isolated by streets and further showing a beam induced release of an LED device according to an embodiment of this invention.

FIG. 4 shows an LED source assembly 400 where a plurality of fully singulated LED devices such as LED device 401 reside on a surface of a transparent source substrate 402 with an interface 403. The source substrate can be a double-sided polished (DSP) sapphire substrate such as a MOCVD growth substrate or a quartz or glass substrate if the LED device layer was released and subsequently bonded. An energy beam such as a laser 404 is shown as releasing LED device 405 by beam-induced release effect 406. As merely an example using a GaN LED device grown on a DSP sapphire substrate, the release is made by decomposing the GaN at the sapphire/GaN interface using a UV laser pulse or pulses to release the device. Of course, there can be other variations, modifications, and alternatives.

The LED device array structure of FIG. 4 can also be released as a full layer onto a secondary substrate via a similar laser lift-off (LLO) process or chemical lift-off (CLO) process that disunites the LED device layer about interface 403. The secondary substrate is now called the source substrate if used as the support to transfer individual LED devices. Of course, there can be other variations, modifications, and alternatives.

Figure 5:
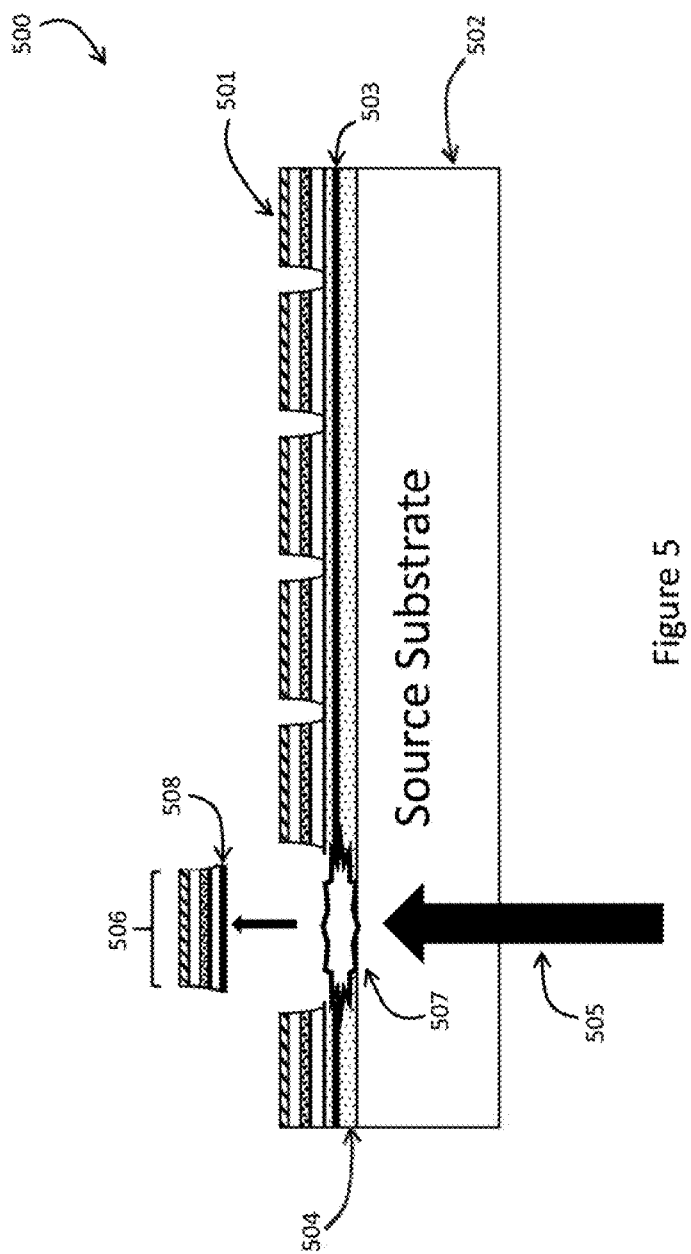
FIG. 5 shows a cross-sectional view an LED source substrate with singulated LED devices isolated by streets and further showing a beam induced release of an LED device according to another embodiment of this invention.

Improvement in the release process can be realized by integrating a release layer sensitive to the beam characteristics such as depicted in FIG. 5. Source assembly 500 have a plurality of LED devices such as LED device 501 residing on source substrate 502. In this embodiment, the LED devices are coupled to the support substrate using a release layer 503 present within a bond layer 504. An energy beam such as a laser 505 is shown as releasing LED device 506 by a beam-induced release effect 507. In this example, the release layer 507 can be optimized to have the release effect be less violent or require less beam pulse energy. If the source assembly 500 is a bonded substrate prior to the LED formation, no prior chemical or laser lift-off steps are required after LED device formation. The post-MOCVD substrate with an integrated release layer can directly become the source substrate for BAR mass-transfer use.

An intervening metal layer or other reflective layer can be integrated between release layer 503 and the LED devices such as LED device 501 if additional protection for the LED devices from the energy beam 505 is desired.

The use of a source substrate using layer-transfer methods can also allow fully processed LED device mass-transfer without requiring additional metal steps or other finishing steps after release. A regular GaN on sapphire process would still require a post-release contact formation however a buried metal layer can be formed on the LED device prior to MOCVD processing and release. Referring to FIG. 5, LED device 506 can include a metal contact 508. Molybdenum is one example of a suitable metal contact layer due to its compatibility. Of course, there can be other variations, modifications, and alternatives.

Examples of a release layer suitable for the 355 nm to 1064 nm YAG laser lines is ITO and other oxides that can readily ablate with femtosecond to picosecond pulses. Processes to ablate ITO is described in "Picosecond Laser Patterning of ITO Thin Films", A. Risch & R. Hellman, Physics Procedia, 12 (2011) 133-140. The study included 355 nm, 532 nm and 1064 nm where 50-100 nm of ITO was ablated using a single pulse of about 100 in energy at a spot size of about 42 µm, corresponding to a process of 0.5 J/cm$^2$. Ability to release with one pulse, tight beam focusing allowing the beam to be focused well enough to reliably release a target LED device while not affecting neighboring LED devices and X-Y positional accuracy and repeatability are among the important release beam optics and other characteristics for suitability within a BAR mass-transfer application. Of course, there can be other variations, modifications, and alternatives.

The LED device array structure of FIG. 5 can also be released as a full layer onto a secondary substrate via a similar laser lift-off (LLO) process that disunites the LED device layer about release layer 503 or using a chemical lift-off (CLO) process that selectively removes bond layer 504. If a CLO process is used, a release layer 503 may not be needed and the lift-off process would occur by using a chemical process to release the plurality of LED devices onto the secondary substrate. For example, a bath containing hydrofluoric (HF) acid could selectively etch a bond layer 504 comprising silicon dioxide to release the LED device layer 501 onto a secondary substrate made of a material that is not attacked by the etchant. Teflon is one example of a suitable secondary substrate material that is not etched by HF. The secondary substrate is now called the source substrate if used as the support to transfer individual LED devices. In another embodiment where an LLO mass-transfer process is desired, the Teflon intermediate substrate after the CLO lift-off of the LED device layer can be bonded to an optically transparent third substrate. This third substrate is now called the source substrate to allow the laser lift-off mass-transfer process using a BAR mass-transfer release layer situated between it and the LED device layer. Of course, there can be other variations, modifications, and alternatives.

In embodiments where the source assembly 500 is fabricated from a previously released layer of LED devices 501 from a MOCVD growth substrate and bonded onto a secondary substrate 502, the choice of the BAR mass-transfer release layer 503 can be less restricted since it does not have to be subjected to high-temperature MOCVD and other LED device formation processes. For example, the release layer could be an organic or inorganic release layer with a limited high-temperature stability range. An organic UV or thermal release layer could be utilized, similar in function to release tape products such as the ELEP HOLDER UV release tape and the NWS-Y5V thermal release tape manufactured by the Nitto Denko Corporation, Osaka Japan. To be effective in this application and support high-throughput assembly, thin films with low UV fluence and thermal budget formulations are required. An inorganic release layer would preferably be a thin layer that can efficiently decompose upon BAR irradiation to a state of low adhesion. Of course, there can be other variations, modifications, and alternatives.

For the rest of this description, the following source assembly will be assumed:
a. Source substrate is a DSP sapphire substrate of 150 mm in diameter and 1 mm in thickness having a release layer (RL) releasable with a 0.5 J/cm$^2$ pulse process with a 355 nm, 532 nm or 1064 nm laser source capable of individual LED device addressing.
b. LED device array of 15 µm×15 µm (10 µm device width with a vertical device architecture and a 5 µm gap or street between devices). Top is anode and bottom is cathode.
c. LED device array is a square array of 105 mm×105 mm in size containing 70,000×70,000 LED devices or 49 million individual LEDs.
d. LED devices as released are fully contactable as completed devices.

After the formation of the LED devices on the source substrate, testing of the LED devices for meeting certain predetermined criteria can be made. FIG. 6 shows the source LED substrate undergoing a test to determine the functionality of the individual LED devices on the source substrate using an electro-optical test such described in U.S. Pat. Application No. 62/522,576 entitled "LIGHT EMITTING DIODE (LED) TEST APPARATUS AND METHOD OF MANUFACTURE". The test method utilizes a field plate and bottom electrode to capacitively inject a current to a plurality of the LED devices on the source substrate and measure its response using a sensor such as a camera. The test configuration 600 is shown in FIG. 6A where a field plate 601 is present over source substrate 602 above the plurality of LED device structures such as LED device 603 separated by an interface region 604 that can support capacitive coupling from the field plate 601 to the LED devices such as LED device 603. Under the lowest LED device structure layer (the n-layer in examples described in this invention), a dielectric layer 605 and electrode 606 completes the support substrate capacitive coupling device. Electrode 606 is connected to a voltage source 607. The field plate is connected to a separate voltage source 608 and field plate electrode 609. In this example, a camera 610 is placed above the field plate to capture the light emission response of the plurality of LED devices under test. In this example, the isolation between devices is shown to be complete, however this method would still function with or without full isolation of the n-layer.

Figure 6B:
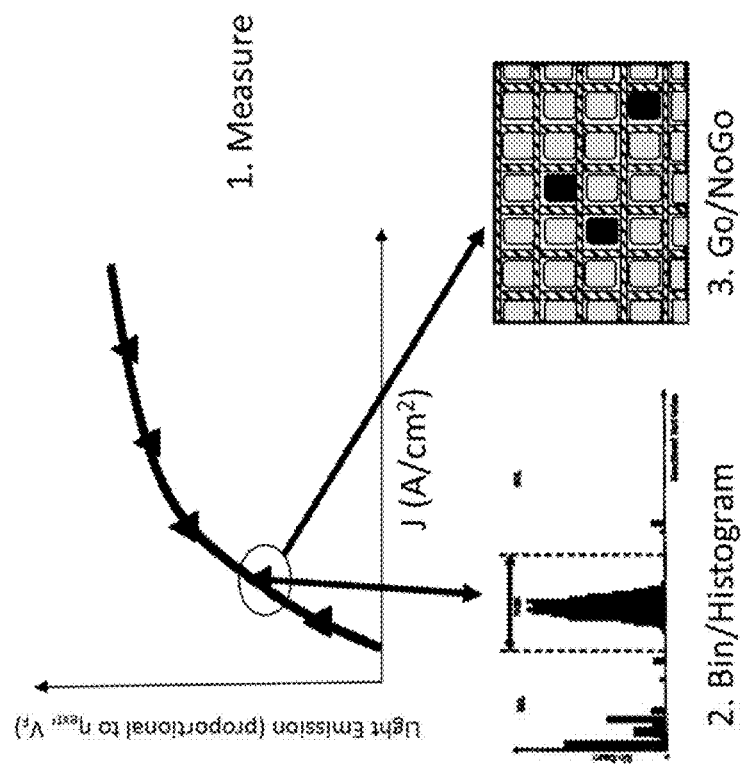
FIG. 6B shows the measurement, bin/histogram analysis and the generation of a go/nogo determination of LED functionality using a test step according to a specific embodiment of this invention.
Figure 6A:
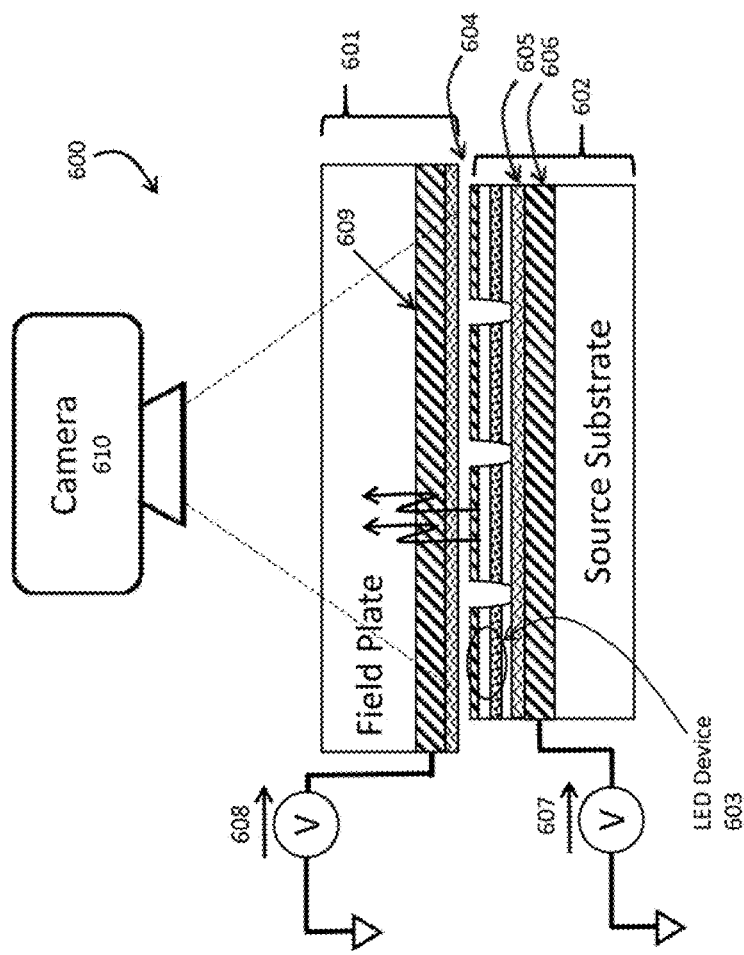
FIG. 6A shows a testing step of a source substrate assembly according to a specific embodiment of this invention utilizing a field plate in close proximity to a portion of a LED device layer containing 4 LED devices on a support substrate with a buried common contact and dielectric layer.

The measurement result of this functional test is shown in FIG. 6B (1) as a value proportional to the emission of each LED device as a function of an injected current density J ($A/cm^2$). The collection of a plurality of LED device results and be stored as a value according to the LED position in a matrix (i,j) for further analysis. For example, a histogram of the matrix (i,j) such as depicted in FIG. 6B (2) can show process insight. Once the LED device (i,j) data values are collected, a threshold or set of test criteria can be applied to develop a determination of functionality, perhaps adding a $Data_n(i,j)$ value of 0 or 1 (0=bad device, 1=good device) for each LED being measured. For example, non-emitting or weakly emitting devices could be labeled as bad devices if a desired minimum threshold is applied to the data. FIG. 6B (3) shows an example of the threshold result applied to the (i,j) data at a specific J value. Three LED devices falling outside of the threshold values selected are labeled as "bad" pixels and their locations would be recorded in the resulting Known Good Die (KGD) database file. Of course, multiple thresholds and other criteria applied to the set of data values or the pass/fail criteria could also be useful in functional test, repair strategies and process yield analysis (cause and correction). As merely an example, multiple thresholds could be applied to the LED device $Data_n(i,j)$ data to generate a bin number label for each LED device to match LEDs in functionality and drive a strategy of releasing devices with similar characteristics according to a criteria or set of criteria. Random-access laser lift-off or other individual LED device release methods could aggregate LED devices having similar bin numbers based on the bin label matrix value for each (i,j) LED device. This could be useful to limit display non-uniformity caused by using LED devices having excessively different functional characteristics. Multiple thresholds could also be utilized to develop statistics useful for yield and process control. For example, the standard deviation and other statistical analyses applied to bin data can be an indicator of yield and process stability. Sudden changes in these derived quantities can signal a process excursion. Of course, there can be other variations, modifications, and alternatives.

Although the KGD file can be as simple as a list of bad die locations, it is understood that there may be more sophisticated criteria such as matching LED devices with close or uniform response for release within a target display. Binning would be adjusted to match devices having characteristics within a predetermined bin range value.

Figure 7:
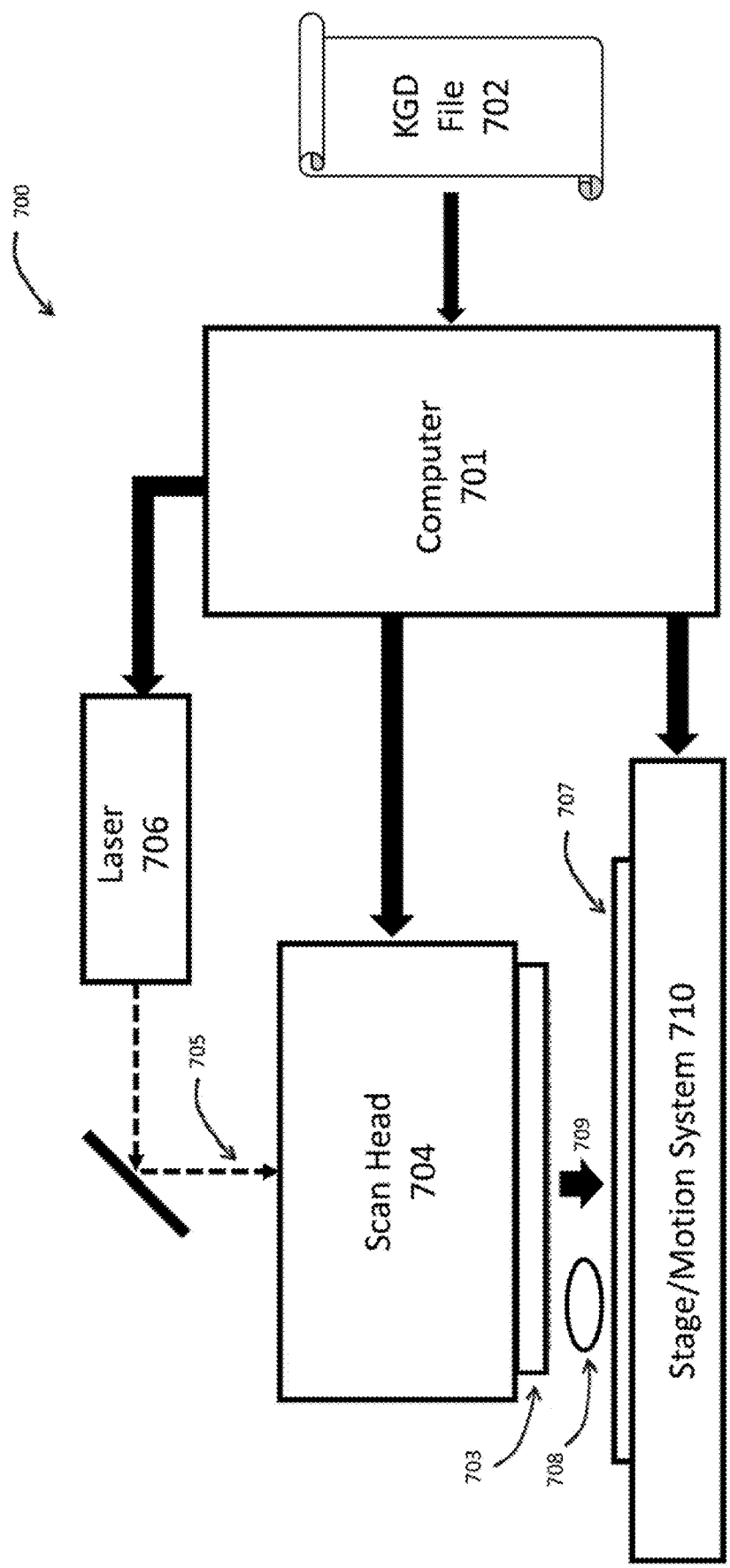
FIG. 7 shows a block diagram of a Beam Addressed Release (BAR) mass-transfer system according to a specific embodiment of this invention.

Assuming a good/bad KGD file is produced from the test of the source substrate, the substrate can now be mounted onto a print head of a Beam-Addressed Release (BAR) mass-transfer tool to populate a target array with a plurality of LED devices. The BAR mass-transfer system block diagram 700 is shown in FIG. 7. The BAR system is composed of a computer 701 receiving a KGD file 702 that will serve to execute an algorithm to release a plurality of LED devices present on the corresponding source substrate 703. The algorithm utilizes input parameters such as the KGD file data, source and target array pitch and dimensions and selection and matching criteria to populate the target substrate with high speed and yield. The source substrate 703 is attached to a scan head 704 that can direct a laser beam 705 from a laser system 706. The beam is addressed to individual LED devices according to preselected conditions as further explained below. The beam is adjusted to be able to release specific LED devices from the source substrate 703 to a target substrate 707 across a gap medium 708. The transference of the LED devices is shown as a disuniting action from the source substrate 703 to a uniting action on a predetermined location on the target substrate 707 by arrow 709. In this specific embodiment, relative motion between the source and target substrates is accomplished using a stage/motion system 710.

Figure 8B:
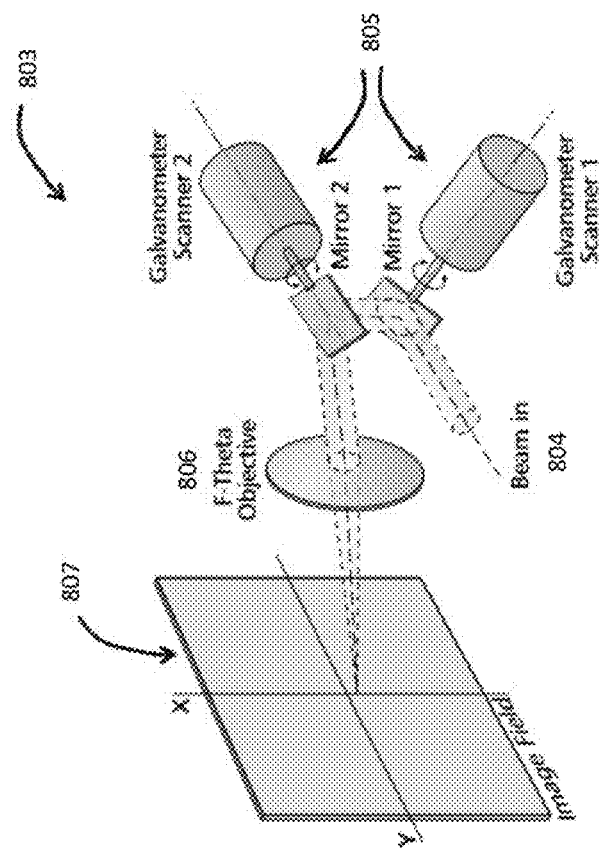
FIG. 8B shows a galvanometer X-Y mirror beam scanning system with f-theta lens for use within a Beam Addressed Release (BAR) mass-transfer system according to a specific embodiment of this invention.
Figure 8A:
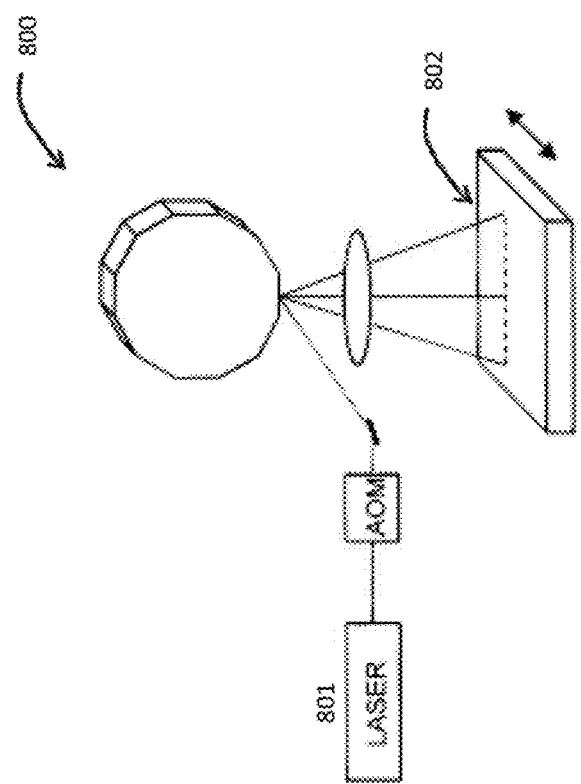
FIG. 8A shows a polygonal beam scanning system for use within a Beam Addressed Release (BAR) mass-transfer system according to a specific embodiment of this invention.

The BAR mass-transfer system scan head hardware can use commercially available systems that support high-throughput and high-yield operation. The scan head X-Y scan be realized using (i) a rotating polygon mirror scanner in one dimension with a galvanometer mirror or mechanical scan in the second dimension or (ii) a two-dimensional laser scanner such as a galvanometer motor-driven mirror in each of the two scan dimensions. FIG. 8A shows a figure of a rotating polygon mirror scanner 800 to scan a laser beam 801 onto a surface 802. Such systems are available from companies such as Lincoln Laser Company, Phoenix, Ariz. USA. FIG. 8B shows a X-Y scan head 803 scanning an input laser beam 804 using a dual axis galvanometer mirror assembly 805 and optical lens 806 to scan a target surface 807. There Such systems are available by companies such as Lincoln Laser Company, Phoenix, Ariz. USA and Scanlab GmbH, Puchheim, Germany. To allow random-access addressing without compromising throughput, a X-Y galvanometer coupled to an optical f-theta lens can be an effective solution for the scan head. For example, a Scanlab IntelliSCAN 10 coupled to a near-telecentric lens such as a 255 mm f-theta lens would allow a 180 mm×180 mm scan area with a spot size of about 20-30 μm and up to 8000 mm/sec scan speed. Such a system is available for Coherent Inc., Santa Clara, Calif. USA as a PowerLine Pico series laser marking system. Other telecentric lens laser scanners such Model MD-T1000 are available by Keyence Corporation, Osaka Japan. The MD-T1000 has 80 mm×80 mm full telecentric scan capability, ~20 μm spot size and up to 12,000 mm/sec scan speed.

Although the X-Y galvanometer-based scanner has more flexibility, a large scan area is often realized by employing a scanning lens with a longer working distance and lower numerical aperture. The result is a larger spot size at the image plane. A rotating mirror scanner could use a linear lens placed closer to the image plane field to help better focus the optical beam in one dimension. If further reduction of the beam size is desired to better localize the beam energy within desired LED device areas, the beam can be truncated using a mechanical mask or an optical apodizer in close proximity to the image plane. The mask would have a desired pattern of openings to match the desired LED device transfer pattern and be spatially adjusted in X, Y and rotation axis with respect to the target substrate. This beam spatial filtering method may also be necessary if the laser system is more slowly modulated or has a longer pulse width that effectively "smears" the beam intensity profile along the scan direction. In this example, a mechanical mask with a slit perpendicular to the scan direction and an opening roughly the size of the LED device would remove optical energy that could spill over to adjacent areas and cause erroneous LED device transfers. Of course, there can be other variations, modifications, and alternatives.

The LED device transfer from the source substrate(s) to the target substrate can be accomplished using different scan and motion methods. One example is a scan pattern in one direction (ex. X-axis) while the scan head and target substrate is moved in another direction (ex. Y-axis). A laser scanner utilizing a polygon rotating mirror could work within such an embodiment. Another example is to move the source substrate to a location called a site and have an X-Y scan head populate the LED devices for the selected site. A micro-jog (small X-Y move within a site) to allow KGD LED devices to become matched to one or more pixels that were not previously matched with KGD LED devices may be necessary. Once the site has been populated with LED devices, a site move is made to a new area. This process is repeated until the target substrate is fully populated. The succeeding examples will generally utilize the X-Y scan head embodiment described above however it is to be recognized that other relative positioning of KGD LED devices to a target substrate can be realized using variations, modifications, and alternatives embodiments of this invention.

The laser system must be able to direct a beam that can be focused and support flexible and accurate release timing synchronized with the scan head beam location. A Q-switch laser may suffice to perform the release function however its relatively high pulse to pulse energy variation, timing jitter, longer pulse width and inter-pulse duration effect on pulse energy are all considerations that make this common marking and cutting laser technology less suitable for BAR mass-transfer applications. A particularly suitable laser is a passive mode-locked laser system such as the PicoBlade 2 Picosecond Micromachining Laser from Lumentum Operations LLC, Milpitas, Calif. USA. The laser can be triggered and synchronized at a repetition rate from 50 Khz to 8 Mhz with fine frequency resolution. For each time period, an ultra-short laser pulse is emitted that serves as a release process by ablating the release layer to release an individual LED device for each laser pulse. Of course, multiple LED devices could be designed to be released for each laser pulse in other embodiments.

Figure 9:
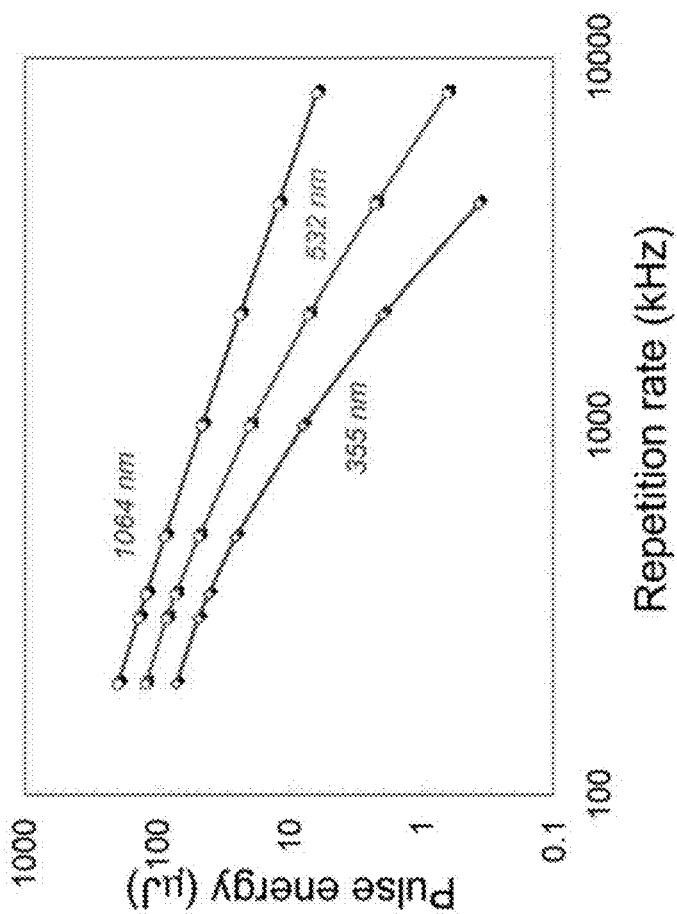
FIG. 9 shows the pulse energy as a function of pulse repetition rate for a specific laser system useful as a beam release laser source according to a specific embodiment of this invention.

A digital signal can select individual pulses to exit the laser on demand. This "Pulse-on-Demand" (PoD) allows operational regimes that can be used by the computer to select only the desired KGD LED devices for release onto the target substrate. The PicoBlade 2 laser pulse width is about 10 ps, assuring an ablation process with minimum Heat-Affected Zone (HAZ) effects on the target release layer and surrounding materials. For typical materials with a characteristic heat diffusion constant of about 1 cm²/sec, the HAZ would be less than 0.05 µm. FIG. 9 shows the pulse energy to pulse repetition frequency relationship of the PicoBlade 2 high-power version. Assuming a 532 nm process and 10 µJ minimum pulse energy, this laser system can allow a pulse repetition rate exceeding 1 MHz. Of course, there can be other variations, modifications, and alternatives.

Figure 10:
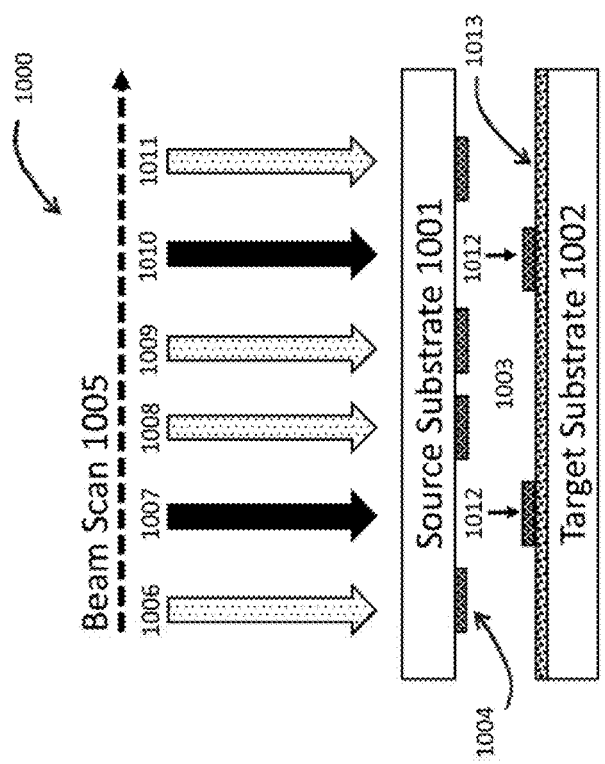
FIG. 10 describes the basic scan process for LED device release according to a specific embodiment of this invention.

The basic LED device release scan process 1000 is shown in FIG. 10 as a cross-section of a source substrate and target substrate undergoing a release laser scan. The source substrate 1001 is positioned over the target substrate 1002 with a gap medium 1003. The gap medium can be air or another interface medium with a gap separating the source to target substrate. Of course, actual contact between the two substrates (no gap) is another possible embodiment.

The goal of having a single laser pulse reliably and uniquely release an addressed LED device places minimum requirements on the beam spot size, energy level and stability, and positioning accuracy and repeatability. A gaussian spot size of about 20 um should be sufficient to selectively release an LED device pitch of about 15 µm or greater. A mask within the source substrate or apodizer/beam shaper may also be effective to keep any stray energies from potentially causing unwanted partial or full release of adjacent LED device. Of course, there can be other variations, modifications, and alternatives.

The laser beam is scanned across a plurality of LED devices such as LED device 1004. In this example, scan system to laser synchronization is made to cause a laser pulse to be emitted by the laser system as the beam position is scanned over each source substrate LED device position through a scan process 1005. A digital signal from the computer will gate the laser pulse from exiting the laser system (utilizing the pulse-on-demand or PoD feature of the PicoBlade 2 system). In this example, the KGD data and matching algorithm determined that LED devices under beam position 1007 and 1010 will be released while the LED devices under beam position 1006, 1008, 1009 and 1011 will not be released. As the beam is scanned from left to right using scan process 1005, the PoD gate signal will be generated to control the laser pulse emission as follows: 1006/OFF, 1007/ON, 1008/OFF, 1009/OFF, 1010/ON, 1011/OFF. For the two instances 1007 and 1010 where the beam is emitted and causes the LED device release process, LED devices 1012 where transferred from the source substrate 1001 to the target substrate 1002. A material 1013 may be added to the target substrate to facilitate capture or retention of the transferred LED devices 1012.

Figure 11B:
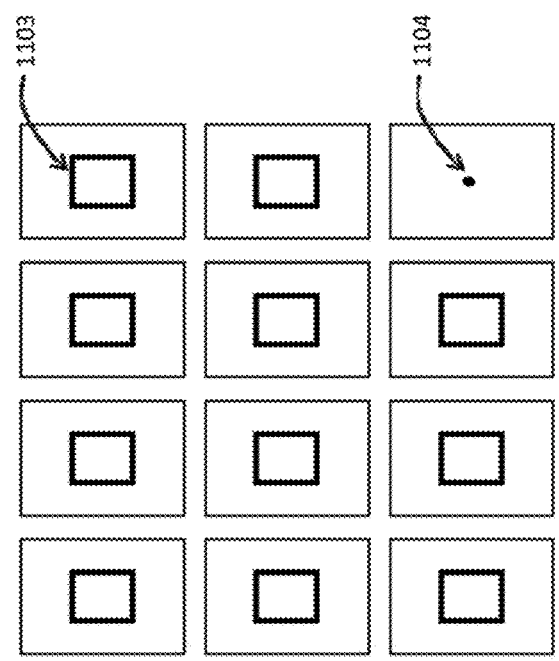
FIG. 11B shows a target substrate pixel array with 2 footprint patterns undergoing a scan process for LED device release according to a specific embodiment of this invention.
Figure 11A:
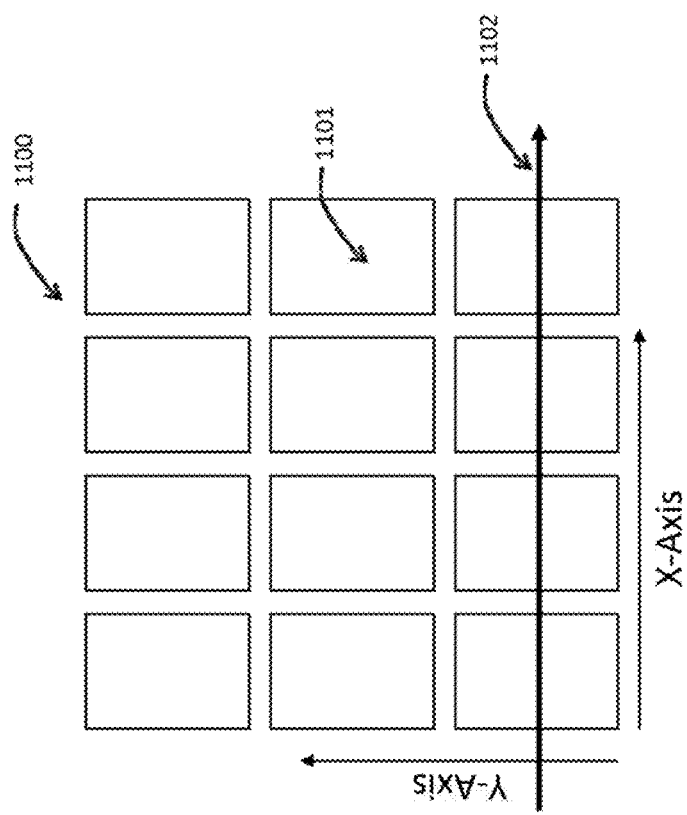
FIG. 11A shows a target substrate pixel array undergoing a scan process for LED device release according to a specific embodiment of this invention.

A scan speed is assumed to be synchronized with the pulse repetition rate according to the following conditions:
$P_{LED}$=LED pitch along the scan direction (m)
$P_{pixel}$=Pixel pitch along the scan direction (m)
$F_l$=Laser pulse repetition rate (Hz)
Scan speed=$P_{LED} \times F_l$ As merely an example, a target pixel array 1100 for the target substrate is shown in FIG. 11A. Each pixel 1101 in this example has a pixel pitch of 75 µm in X and 120 µm in Y. The release laser is scanned in the X-axis such as scan path 1102. For the source substrate assembly previously described with a square 15 µm pitch and a laser pulse frequency of 500 KHz, the required scan speed to have each laser pulse coincide with each possible source substrate LED device location along one axis is 7,500 mm/sec. In this example, one out of every 5 laser pulses may be selected to release a particular LED device onto a target LED pixel area in the X-axis (75 µm pixel pitch/15 µm LED device pitch). The matching criterion for enabling this PoD trigger signal to the laser operating at 500 KHz is a set of conditions as follows:

For each LED location that the laser scans across:
a. The source LED location is KGD
b. The target pixel location is within a footprint area The footprint area is an area within the pixel area where the LED device center locations are allowably transferred. The footprint area center location is $X_{FP}$, $Y_{FP}$ within the pixel area with a range $\Delta X_{FP}$, $\Delta Y_{FP}$. For the example of FIG. 11A and assuming $X_{FP}$, $Y_{FP}$ is the physical center of the target substrate pixel, FIG. 11B shows an example where the footprint 1103 has a range $\Delta X_{FP}$ of 30 µm and a $\Delta Y_{FP}$ of 42.5 µm (2 & 2.5 LED device pixel pitch respectively).

Of course, the range $\Delta X_{FP}$, $\Delta Y_{FP}$ can be zero such as pixel location 1104, necessitating the target substrate pixel pitch to be an integer multiple of the LED device pitch in each direction to minimize X-Y motions between the scan head/source substrate and the target substrate. This may be required if accurate LED device placement is required. A lateral LED device architecture may be one such case where a footprint process with $\Delta X_{FP}$=0, $\Delta Y_{FP}$=0 may be required.

A KGD LED device population process with a minimum pixel footprint area allows a substantial increase in flexibility and throughput of the BAR mass-transfer method. To be maximally effective, the minimum footprint range should accommodate at least 2 possible LED devices. If this occurs in X and Y, there will be 4 possible LED devices that can be selected for release to each target pixel area. The relaxation of the specific position of the LED device onto each pixel area affords substantial benefits. One is that X-Y location accuracies can be relaxed, simplifying system hardware and increasing yield. Another is that multiple possible LED devices within each footprint can allow the scan head to populate a site more completely without requiring physically repositioning the scan head. For example, a 100 ppm non-KGD rate (percentage of bad or unavailable LED devices) for a source substrate used within the 4 k-UHD example described below will have an average of 24 LED devices in each site that cannot be matched/released. Micro-jogging will have to occur to line up KGD LED devices over each of these residual pixels, thus lowering throughput. A 2×2 LED device array within a footprint can lower this error rate greatly. Assuming a random location of each non-KGD LED device within the source substrate, this effective error rate number falls to 100 ppm$^4$ or $1\times10^{-16}$. Over ten billion sites could be printed without a need to micro-jog, thus increasing throughput.

Once the source substrate is utilized for site LED device population, the KGD file is updated with the released LED device locations and the effective non-KGD rate will grow and start containing release patterns. Throughput optimization would include maximizing KGD to footprint matching to drive site to site positioning. Once the non-KGD rate is high enough that site micro-jogging grows too numerous according to a predetermined criterion, the source substrate is exchanged for a new source substrate and KGD file.

A process with a sizable footprint area can help speed the BAR mass-transfer process and accommodate unavailable LED devices as described in the source substrate's KGD database file. For the next example, the example of FIG. 11A with a footprint 1103 of FIG. 11B is assumed.

Figure 12B:
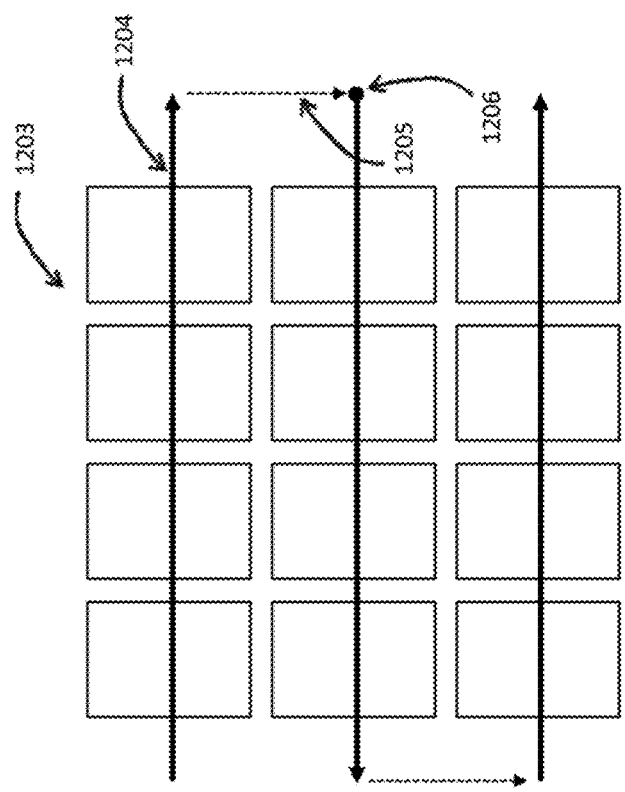
FIG. 12B shows a target substrate pixel array with 2 footprint patterns undergoing a scan process for LED device release according to a specific embodiment of this invention.
Figure 12A:
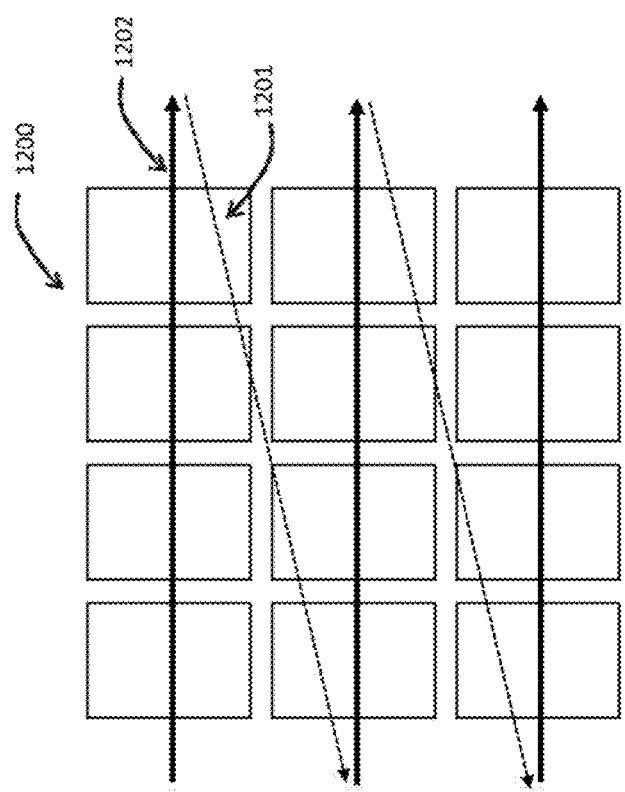
FIG. 12A shows a target substrate pixel array undergoing a scan process for LED device release according to a specific embodiment of this invention.

FIG. 12 shows two possible scan patterns to locate the beam over the target substrate pixel locations. FIG. 12A shows a unidirectional scan of a target pixel array 1200 where a retrace path 1201 is made after each pixel line scan 1202 to reposition the scan system for another unidirectional scan (in this case from left to right). Although the retrace is longer than a bidirectional scan, there may be practical advantages in improving motion dynamics such as reducing scan hysteresis. A potentially faster scan pattern is a bidirectional scan pattern such as shown in FIG. 12B for the X-Y scan of a target pixel array 1203 on a target substrate. At the end of each scan path 1204, a short jog 1205 to a new scan start point 1206 is made and the next scan is in the opposite direction from the previous scan path. The timing of each new scan path is synchronized with the laser system to align each possible laser pulse to the LED devices along the scan path. Of course, there can be other variations, modifications, and alternatives.

Figure 13:
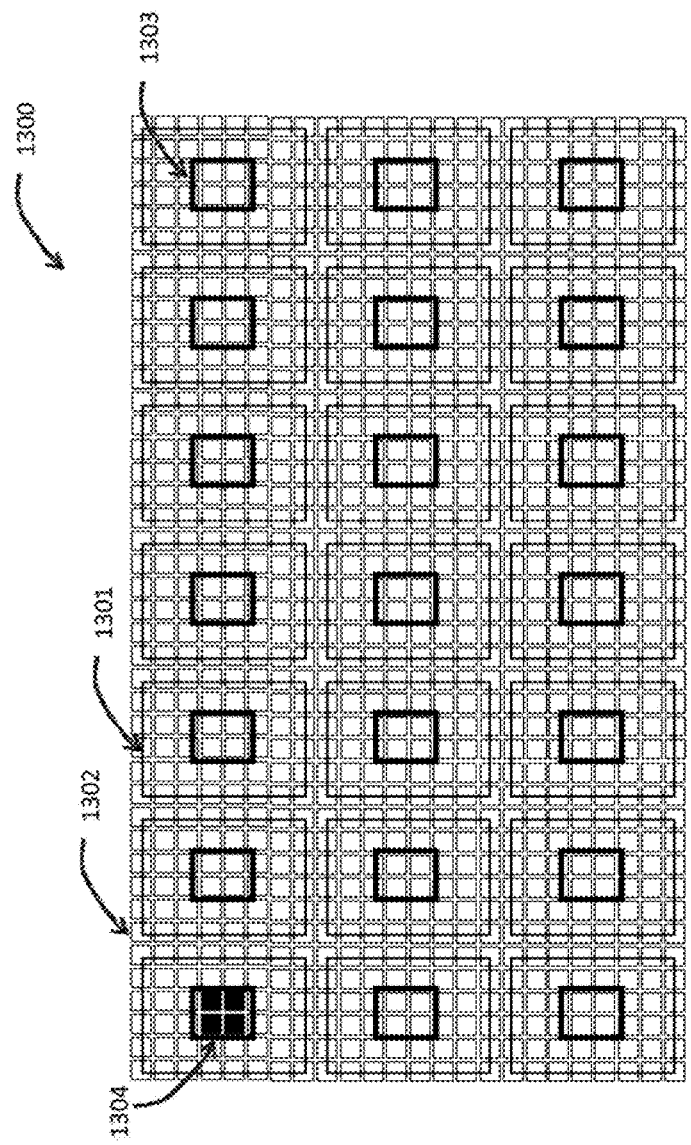
FIG. 13 shows a source and target substrate overlay and the footprint pattern according to a specific embodiment of this invention.

FIG. 13 shows a top view of the source substrate to target substrate transfer process 1200 according to a preferred embodiment of this invention. The target substrate requires each of its pixels 1301 to be populated by an LED device from the source substrate array 1302 of LED devices within the allowable footprint 1303 within each pixel. The footprint in this example allows 4 possible LED devices to be selected for release as shown in 1304. The black LED devices satisfy the footprint area release conditions. The particular LED device location selected for release would also have be available (KDG and not previously released) and optimized for throughput as further explained below.

Figure 14:
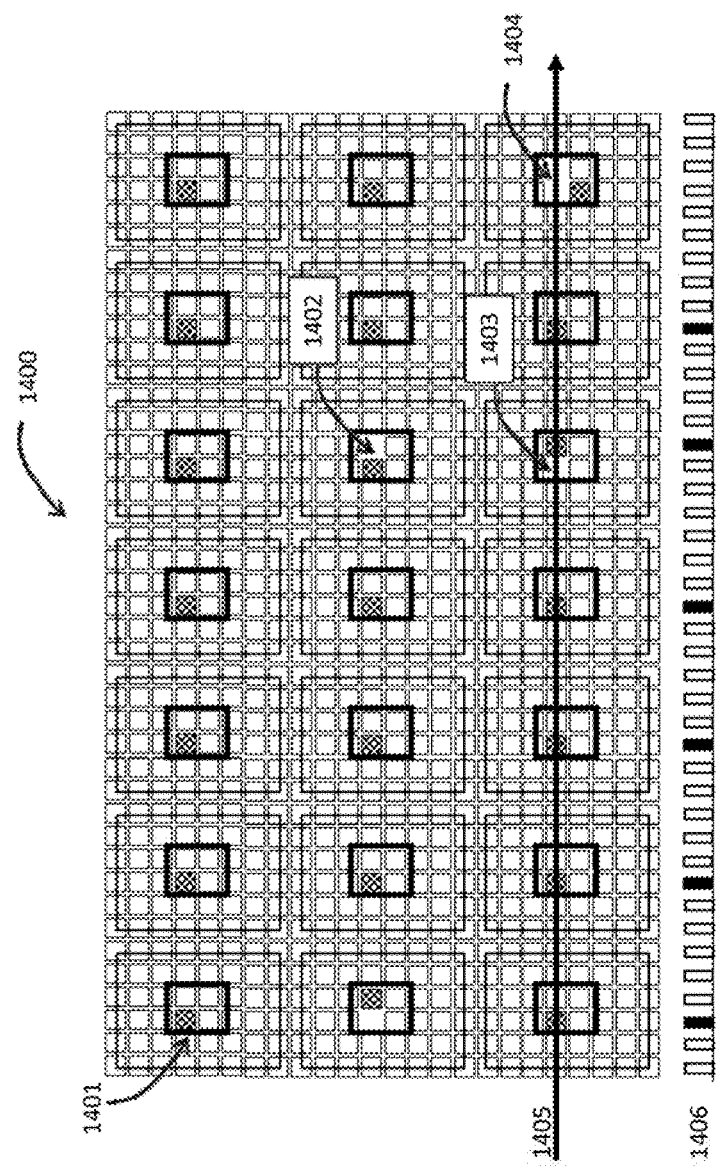
FIG. 14 shows a source and target substrate overlay undergoing a scan process for LED device release according to a specific embodiment of this invention.

FIG. 14 shows a top view of the source substrate to target substrate transfer process 1400 according to a preferred embodiment of this invention. The scan paths and beam release criterion were calculated based on the X-Y position and KGD database file. The hashed LED device location such as 1401 show a LED device position that has been released. If there are some unavailable LED device locations within the footprint such as locations 1402, 1403 and 1404 (both locations), the algorithm may change the beam release to coincide with alternative LED device positions to populate the pixel positions. Beam scan 1405 and pulse pattern 1406 shows how the bottom pixel row would be populated. In this example, the beam is scanned at 7500 mm/sec and crosses each LED device center location every 2 μsec. The laser is set for 500 KHz passive mode-locking and sends a 10 psec laser pulse every 2 μsec coincident with each LED device center location depending if the PoD is enabled. The black rectangles in pulse pattern 1406 are emitted pulses that cause the corresponding LED devices to be released while the white boxes are pulses that were commanded not to be emitted from the laser using the PoD control signal. Pixel 1404 has no release during scan path 1405 and would require a separate scan path (not shown) to release an alternative LED device located on a lower LED device row.

Figure 15:
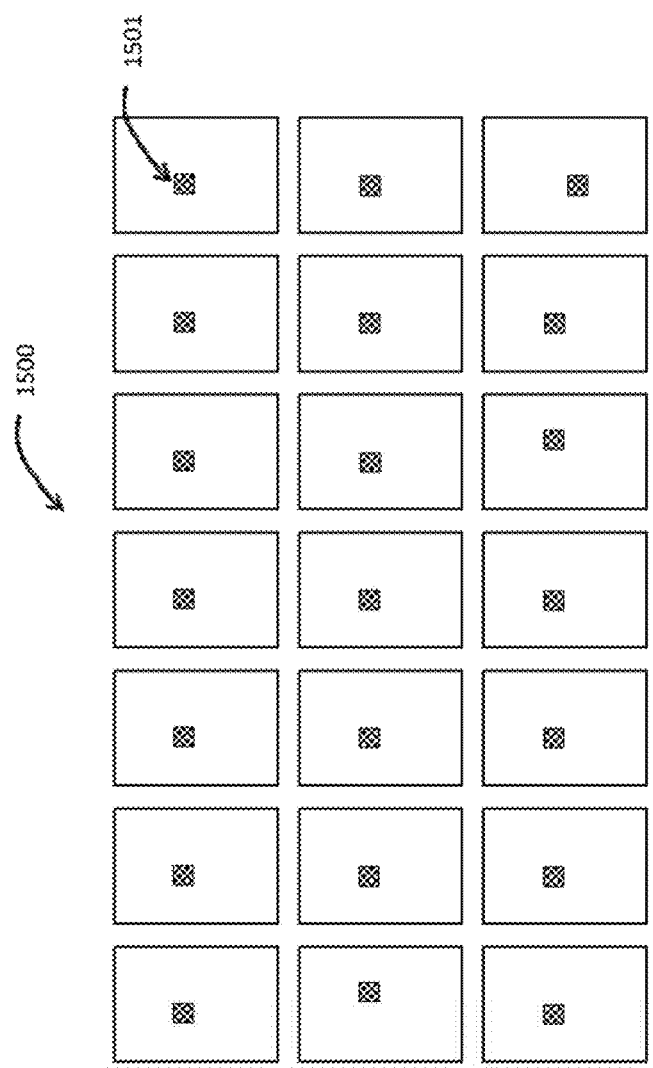
FIG. 15 shows a target substrate after a scan process for LED device release according to a specific embodiment of this invention.

FIG. 15 shows the resulting target substrate pixel array 1500 populated with LED devices such as LED device 1501.

The optimum BAR mass-transfer throughput can be estimated in this example as follows:

a. LED release rate=500 KHz×(15 μm LED device pitch/75 μm pixel pitch)=100 k LEDs/second
b. Scan time=105 mm/7,500 mm/sec=14 msec
c. Retrace time (assume bidirectional scanning)=5 msec
d. Pixels/scan=105 mm/75 μm pixel pitch=14,000 pixels
e. Throughput=14,000 pixels/19 msec=74 k pixels/second or 265 Mpixels per hour A 70M LED device source substrate will therefore need to be changed once its LED devices have been largely released. At the above release rate of 265M LED devices per hour, a new source substrate will need to be loaded every 15-16 minutes. Because the release rate will start dropping before the LED devices have all been released due to the increasing number of unavailable LED devices, optimum throughput will require an early exchange of the source substrate according to an optimization algorithm that weighs the additional time and cost for an early exchange to the increasing reposition frequency of the source substrate with a decreasing availability of LED devices. To populate a complete display, other parameters such as source substrate exchange time and site to site move time will become factors in the throughput calculation.

The algorithm to predetermine the scan head position and release sequence within each site scan to efficiently release the most KGD LED devices available from a source substrate is an optimization problem that may benefit from artificial intelligence (AI) and deep learning concepts. As the source substrate is used, prior releases will generate unavailable source LED device patterns that can cause an increasing frequency of micro-jogs to reposition the scan head to match previously unavailable KGD devices on pixels within a site. Optimization algorithms using AI/deep learning may help maximize source substrate device utilization and throughput while lowering the total number of site micro-jogging.

Figure 16:
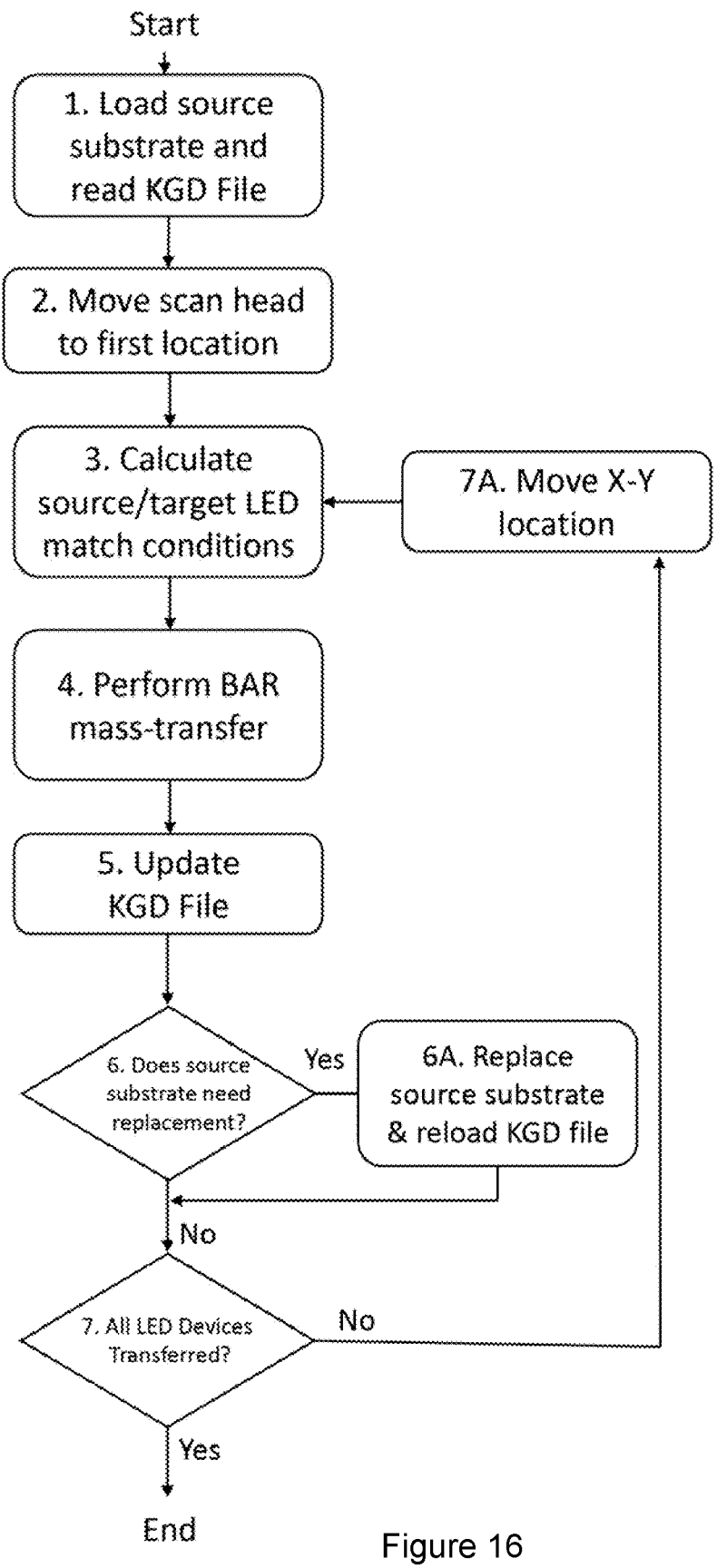
FIG. 16 shows a process flowchart for use of a Beam Addressed Release (BAR) mass-transfer system to populate a target substrate according to a specific embodiment of this invention.

The basic BAR mass-transfer process flowchart is shown in FIG. 16. Once the source substrate and corresponding KGD file is loaded on the scan head and computer (step 1), the computer positions the scan head at the first print location of the target substrate (step 2). A determination of the LED devices matching the release criteria is then calculated (step 3) and the scan head and laser system is then made to address the laser beam pulses to release the desired LED devices onto the target substrate (step 4). Once the list is exhausted, an update of the KGD file is made to add the released LED devices to the list of bad or unavailable LED device locations on the source substrate (step 5). If the number and locations of the residual LED devices on the source substrate fails to meet a predetermined criterion (step 6), the source substrate is replaced and its corresponding KGD file is loaded (step 6A). If there are more locations to populate, the X-Y location is changed (step 7A) and the BAR mass-transfer cycle repeats from step 3.

Example 1: 4 k-UHD Resolution (3840H×2160V 16:9) BAR Mass-Transfer Performance Estimate The following is the expected optimum throughput expected for the above laser conditions using a source substrate with 105 mm×105 mm LED device array of 15 µm pitch. The throughput will be somewhat less since it will not account for source substrate exchange time and site to site move time:
  a. Sub-pixel pitch: 125 µm (H)×375 µm (V)
  b. Number of sites: 11,650 cm² display/110.25 cm²=106 sites/display
  c. Pixels per scan line (H): 105 mm/125 µm=840 pixels per scan
  d. Number of scan lines per site: 105 mm/375 µm=280 lines
  e. Site throughput: 280 scan lines×19 msec=5.32 seconds/site
  f. Total pixels per site: 280 scans/site×840 pixels per scan=235,200 pixels/site
  g. Total time per display: 5.32 seconds/site×106 sites/display=564 seconds/display
  h. Pixel throughput=160M pixels/hour The tremendous throughput improvement potential of this method can be appreciated by comparing the roughly 10' per display throughput of the BAR mass-transfer approach in the above example compared to about 25 hours for a pick and place approach for a similar display, about 125 times faster.

Example 2: 5.5" HDTV Cellphone Display (1920H×1080V 16:9) BAR Mass-Transfer Performance Estimate The following is the expected optimum throughput expected for the above laser conditions using a source substrate with 105 mm×105 mm LED device array of 15 µm pitch. The throughput will be somewhat less since it will not account for source substrate exchange time and site to site move time:

a. Scan time: 68.5 mm/7500 mm/sec=9.13 msec (scan in display vertical direction)
  b. Sub-pixel pitch: 21.1 µm (H)×63.4 µm (V)
  c. Number of sites: 1.16 sites/display
  d. Pixels per scan line (V): 68.5 mm/63.4 µm=1080 pixels per scan
  e. Number of scan lines per site: 105 mm/21.1 µm=4975 lines
  f. Site throughput: 4975 scan lines×13.13 msec=65.3 seconds/site
  g. Total pixels per site: 4975 scans/site×1080 pixels per scan=5.37M pixels/site
  h. Total time per display: 65.3 seconds/site×1.16 sites/display=75.7 seconds/display
  i. Pixel throughput=296M pixels/hour The above examples generally describe a footprint with a finite area that allows multiple possible LED devices to be selected for release. This approach imposes certain restrictions and conditions regarding the LED device and interconnection design. One design that allows flexible LED device location positioning within a pixel is a vertical LED design and a top/bottom area contact method using an anisotropic contact film as described below. FIG. 17A shows an active-matrix Thin-Film Transistor (TFT) pixel backplane circuit 1700 that can be used to bias each individual LED device 1701 within a pixel area. To generate a display pattern on a display, each pixel LED device is controlled by 2 transistors M1 and M2. Transistor M1 is a gate transistor that receives a voltage from the Vdata line when Vscan turns M1 on and transfer a voltage Vg related to Vdata to a storage capacitor Cs. This bias voltage Vg in turn controls a second transistor M2 connected as a source follower to develop a current sourced from voltage Vdd. The level of current through the LED device is therefore addressable by this circuit to allow greyscale brightness levels for the pixel.

The LED device 1701 has an anode (denoted by "+") connected to the active-matrix TFT backplane by contact 1702. It also has a cathode (denoted by "−") connected through a backplane 1703 and a voltage Vss by contact 1704.

Figure 17B:
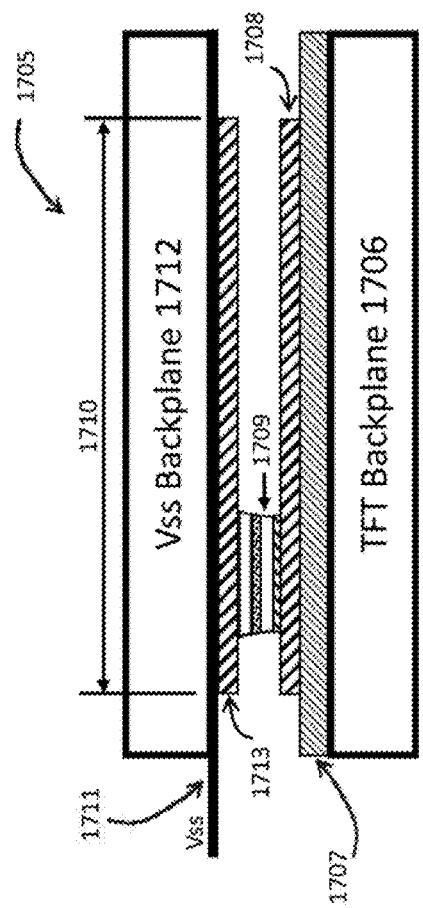
FIG. 17B shows a cross-section of a TFT active-matrix backplane connecting an LED device within a pixel footprint area with a common Vss backplane according to a specific embodiment of this invention.
Figure 17A:
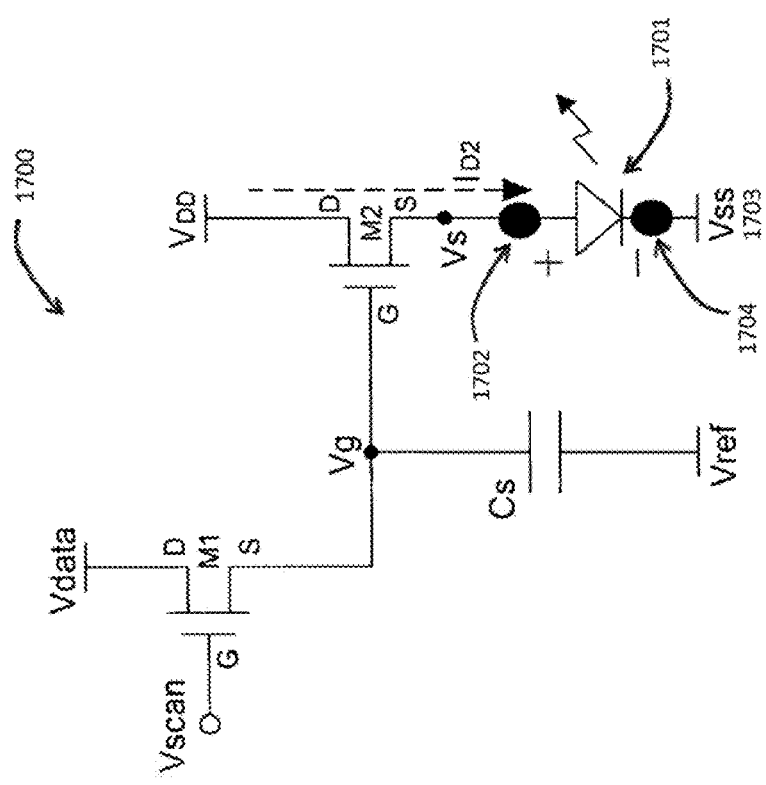
FIG. 17A shows a LED device addressing circuit used in certain embodiments of this invention.

One example of a physical realization of the circuit represented by FIG. 17A is shown in FIG. 17B. In this laminated display structure 1705, a TFT backplane 1706 having the TFT circuitry contained in layer(s) 1707. The anode contact 1702 would connect to an area contact layer 1708. This layer would have the ability to contact a released LED device 1709 located within the area denoted by the range 1710. Range 1710 is related but not synonymous to the footprint range $\Delta X_{FP}$, $\Delta Y_{FP}$ since the footprint denotes the allowable locations of the released LED device centers while range 1710 is the total bond area. LED device 1709 is shown located off-center to show how an arbitrary position of the LED device within the footprint can still allow top and bottom contact. The cathode contact 1704 is made using a common contact 1711 on a Vss backplane 1712 and area contact layer 1713.

Figure 18:
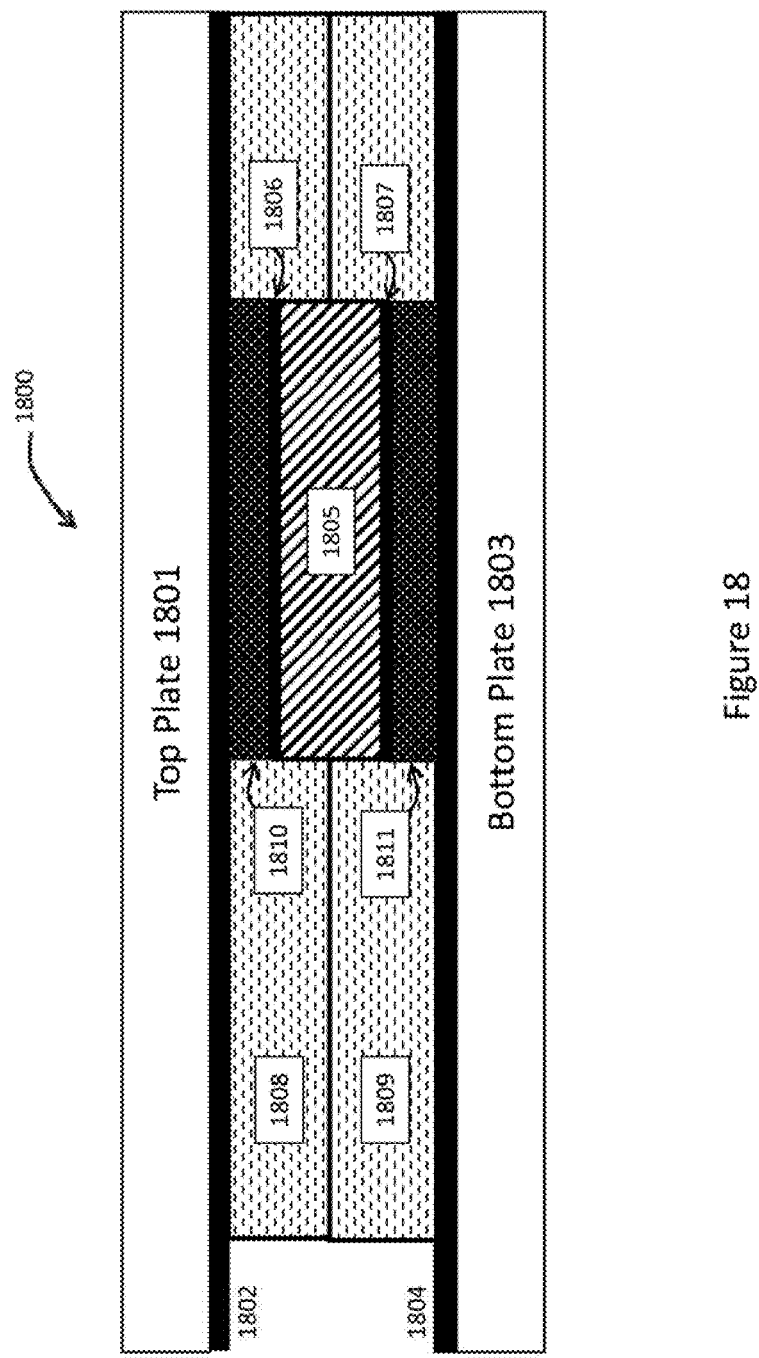
FIG. 18 shows a cross-section of a anisotropic interconnect method for connecting an LED device within a pixel footprint area between two area contacts according to a specific embodiment of this invention.

Area contact layers 1708 and 1713 must have the ability to reliably contact the LED device anode and cathode to the underlying Vss and TFT backplane contacts but resist broadly contacting (shorting) the Vss and TFT backplane contacts. FIG. 18 shows how this can be accomplished by the use of a special material impregnated with conductive particles for area contact layers 1708 and 1713.

FIG. 18 shows an example of how an area contact material such as material 1708 and 1713 depicted in FIG. 17 can be used to selectively contact an LED device. FIG. 18 shows two plates contacting an LED device as assembly

1800. There is a top plate 1801 with a contact surface 1802 and bottom plate 1803 with a contact surface 1804. Each contact surface need to be electrically connected to LED device 1805 having a top contact surface 1806 and a bottom contact surface 1807. The area contact material 1808 and 1809 is a material that can change its electrical conductivity as a function of external characteristics such as temperature, pressure and the like. As merely an example, the LED device 1805 is assumed to have been released onto the bottom area contact material 1809. When the top plate 1801 is fixed onto the bottom plate 1803 using a bond or lamination process, the characteristics of the area contact material is changed from a non-conductive state to a conductive state (regions above 1810 and below 1811 of LED device 1805. This action would complete the circuit for the LED in a general and manufacturable manner while ensuring contacts 1802 and 1803 remain in a high impedance state.

Figure 19:
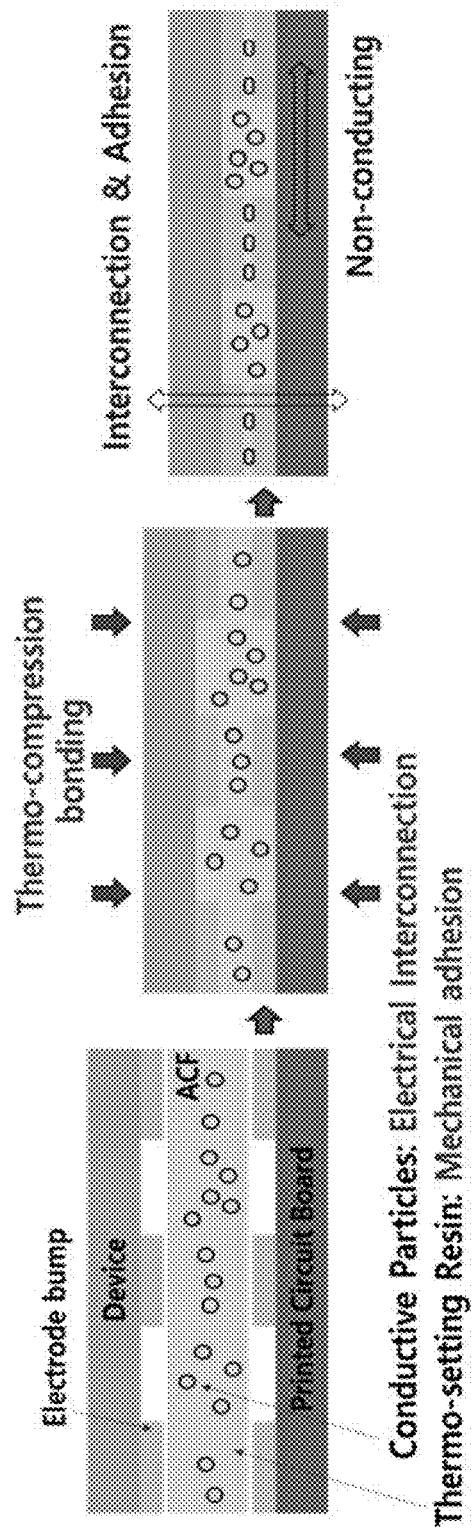
FIG. 19 shows how an anisotropic contact film (ACF) can be used to selectively contact two surfaces with a contact pattern.

One example of a suitable area contact material is an anisotropic conductive film (ACF) that can change from a non-conductive to a conductive state with temperature and pressure. The material is composed of a thermosetting resin impregnated with metallic particles. FIG. 19 shows how a contact pattern can be realized using this material. The example depicts a device to printed circuit board contact application however the material can be adapted to perform in an application described in FIG. 18. Manufacturers of ACF materials include Dexerials Corporation and Hitachi Chemicals Co., Ltd., both from Tokyo, Japan. Special formulations may be required to improve LED device light emission through the ACF material. For example, the conductive particles may comprise of transparent conductive oxide particles such as ITO particles in a clear binder. Of course, there can be other materials, variations, modifications, and alternatives.

The use of a lateral LED device structure instead of a vertical LED device structure in a BAR mass-transfer process with non-zero footprint range is possible. One approach would be to prepare the lateral device to have contact posts in the vertical direction. Separate contacting would occur during the post-transfer lamination/sealing step where the devices are pressed within the multi-level contact area. One terminal would contact a deeper level while the other would separately contact a shallower contact level.

The above examples generally describe the case where the target substrate is a display backplane but this is not necessary. The target substrate can be any suitable surface that can serve as a receiving surface for the released LED devices. The target substrate can in turn become a LED carrier for a roll-to-roll or other printing tool that can capture the LED devices arranged on the target substrate and print them onto a final surface. The purpose of the BAR mass-transfer tool in either case continues to be to rapidly and efficiently perform the areal density conversion between the source substrate to a target substrate.

The light output of the LED devices can be in either or both directions (up or down) using a reflective material or transparent conductive electrode depending on specific embodiments.

The previous examples of the BAR mass-transfer method involve an areal density conversion of the source substrate LED device pitch to a different target substrate pixel pitch but this is not necessary. A 1:1 areal density conversion is also possible for applications such as microdisplays for Augmented Reality (AR), Virtual Reality (VR) and microprojectors. In a 1:1 areal density conversion, every pixel will be released during a scan process. Taking the example of a 15 um LED device pitch and a 500 KHz laser repetition rate, the scan speed is still 7,500 mm/sec however all pulses are selected for the release process. KGD file information is less important during execution but nonetheless can be utilized to avoid separating LED device arrays containing defective LED devices.

Testing for completeness of the release process and functionality of the released LED devices after BAR mass-transfer may be made using optical, electrical and electro-optical inspection and test methods before a lamination or other sealing process. Rework may also be attempted based on the inspection and test results.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, although the description and examples has been directed towards GaN LED devices on a planar surface, any planar or curved surface containing photon emitting devices could be transferred using the BAR mass-transfer method. For example, Vertical-Cavity Surface-Emitting Lasers (VCSELs), Organic LEDs (OLEDs), silicon photonics devices and other surface emitting devices could be mass-transferred using this invention. Additionally, in another example, II-VI semiconductor materials and associated devices can also be used. Although the above has been described for a light-emitting device mass-transfer application, the BAR mass-transfer apparatus and method can also be used to transfer other devices such as sensors, MEMS and other microelectronic or opto-electronic devices. For example, accelerometers, positional sensors, magnetic and capacitive sensors, and optical detectors could be made available on a source substrate for release onto a target substrate according to embodiments of this invention. Of course, there can be other variations, modifications, and alternatives. Therefore, the above description and illustrations should not be taken as limiting the scope of the present invention which is defined by the appended claims.

What is claimed is:

1. An apparatus for transferring a plurality of light-emitting device structures disposed on a source substrate to a target substrate, the apparatus comprising:
    a laser source capable of emitting pulses of light sufficient to disunite a portion of the plurality of light-emitting device structures from the source substrate through a beam addressable release process;
    a scan head onto which the source substrate can be releasably mounted, the scan head including a movable mirror system to direct the pulses of light emitted from the laser source within a scan area located on at least a portion of the source substrate mounted onto the scan head;
    a vertical motion and control device to position at least a portion of the source substrate held by the scan head, and containing the plurality of light-emitting device structures, in close proximity to at least a portion of the target substrate;
    a support and motion system capable of enacting relative movement between the scan head holding the source substrate and the target substrate;
    a computer device capable of reading and updating a Known Good Die (KGD) computer file that contains information about the plurality of light-emitting device structures disposed on the source substrate and can control the scan head and target substrate relative motion, and control the laser source;

wherein the beam addressable release process causes the portion of the plurality of light-emitting device structures to be released onto predetermined locations on the target substrate.

2. The apparatus of claim 1 wherein the light-emitting device structures are mounted onto the source substrate with an intermediary release layer.

3. The apparatus of claim 2, wherein the release layer is indium tin oxide (ITO).

4. The apparatus of claim 1 wherein the close proximity to the at least the portion of the target substrate includes a gap medium between the source substrate and the target substrate.

5. The apparatus of claim 4 wherein the gap medium comprises a gas or vacuum.

6. The apparatus of claim 4 wherein the gap medium comprises a liquid.

7. The apparatus according to claim 1 wherein the KGD computer file is updated with locations of released light-emitting structures.

8. The apparatus according to claim 1 wherein the scan head is indexable to a new target area for another beam addressable release process.

9. The apparatus according to claim 1 wherein the close proximity to the at least the portion of the target substrate is actual contact with the source substrate and the target substrate.

10. The apparatus according to claim 1 wherein the movable mirror system includes a rotating polygon mirror scanner in one dimension with a galvanometer mirror or mechanical scan in a second dimension.

11. The apparatus according to claim 10 further comprising an optical mask positionable between the movable mirror system and the source substrate, the optical mask including a slit with an opening width corresponding to a width of a light-emitting device structure of the plurality of light-emitting device structures.

12. The apparatus according to claim 1 wherein the movable mirror system includes a two-dimensional laser scanner in two scan dimensions.

13. The apparatus according to claim 12 further comprising an optical mask positionable between the movable mirror system and the source substrate, the optical mask including a slit with an opening width corresponding to a width of a light-emitting device structure of the plurality of light-emitting device structures.

14. The apparatus according to cliam 1 wherein the laer source is a 355 nm, 532 nm or 1064 nm passive mode-locked laser.

* * * * *